(12) United States Patent
Scher et al.

(10) Patent No.: US 7,750,235 B2
(45) Date of Patent: Jul. 6, 2010

(54) NANOSTRUCTURE AND NANOCOMPOSITE BASED COMPOSITIONS AND PHOTOVOLTAIC DEVICES

(75) Inventors: Erik C. Scher, San Francisco, CA (US); Mihai Buretea, San Francisco, CA (US); Calvin Y. H. Chow, Portola Valley, CA (US); Stephen A. Empedocles, Menlo Park, CA (US); Andreas P. Meisel, San Francisco, CA (US); J. Wallace Parce, Palo Alto, CA (US)

(73) Assignee: Nanosys, Inc., Palo Alto, CA (US)

( * ) Notice: Subject to any disclaimer, the term of this patent is extended or adjusted under 35 U.S.C. 154(b) by 1006 days.

(21) Appl. No.: 11/499,599

(22) Filed: Aug. 4, 2006

(65) Prior Publication Data
US 2010/0139770 A1      Jun. 10, 2010

Related U.S. Application Data

(60) Continuation of application No. 11/008,315, filed on Dec. 9, 2004, now Pat. No. 7,087,833, which is a division of application No. 10/656,802, filed on Sep. 4, 2003, now Pat. No. 6,878,871.

(60) Provisional application No. 60/408,722, filed on Sep. 5, 2002, provisional application No. 60/421,353, filed on Oct. 25, 2002, provisional application No. 60/452,038, filed on Mar. 4, 2003.

(51) Int. Cl.
| | |
|---|---|
| H01L 31/00 | (2006.01) |
| H01L 31/0272 | (2006.01) |
| H01L 31/0352 | (2006.01) |
| H01L 31/036 | (2006.01) |
| H01L 31/04 | (2006.01) |

(52) U.S. Cl. .......... 136/252; 136/260; 136/261; 136/262; 136/264; 136/255; 257/442; 257/461; 257/465; 257/431

(58) Field of Classification Search ......... 136/243–265; 257/431–465
See application file for complete search history.

(56) References Cited

U.S. PATENT DOCUMENTS 5,260,957 A    11/1993    Hakimi et al.

(Continued)

FOREIGN PATENT DOCUMENTS

EP    1087446    3/2001

(Continued)

OTHER PUBLICATIONS

Alivisatos et al., "Perspectives on the physical chemistry of semiconductor nanocrystals" J. Phys. Chem. (1996) 100:13226-13239.

(Continued)

*Primary Examiner*—Basia Ridley
*Assistant Examiner*—Christina Chern
(74) *Attorney, Agent, or Firm*—Andrew L. Filler; Donna M. Fabian

(57) ABSTRACT

Nanocomposite photovoltaic devices are provided that generally include semiconductor nanocrystals as at least a portion of a photoactive layer. Photovoltaic devices and other layered devices that comprise core-shell nanostructures and/or two populations of nanostructures, where the nanostructures are not necessarily part of a nanocomposite, are also features of the invention. Varied architectures for such devices are also provided including flexible and rigid architectures, planar and non-planar architectures and the like, as are systems incorporating such devices, and methods and systems for fabricating such devices. Compositions comprising two populations of nanostructures of different materials are also a feature of the invention.

17 Claims, 13 Drawing Sheets

U.S. PATENT DOCUMENTS

| | | | |
|---|---|---|---|
| 5,293,050 | A | 3/1994 | Chapple-Sokol et al. |
| 5,354,707 | A | 10/1994 | Chapple-Sokol et al. |
| 5,422,489 | A | 6/1995 | Bhargava |
| 5,505,928 | A | 4/1996 | Alivisatos et al. |
| 5,571,612 | A | 11/1996 | Motohiro et al. |
| 5,585,640 | A | 12/1996 | Huston et al. |
| 5,613,140 | A | 3/1997 | Taira |
| 5,690,807 | A | 11/1997 | Clark, Jr. et al. |
| 5,720,827 | A | 2/1998 | Simmons |
| 5,751,018 | A | 5/1998 | Alivisatos et al. |
| 5,897,945 | A | 4/1999 | Lieber et al. |
| 5,990,479 | A | 11/1999 | Weiss et al. |
| 5,997,832 | A | 12/1999 | Lieber et al. |
| 6,036,774 | A | 3/2000 | Lieber et al. |
| 6,048,616 | A | 4/2000 | Gallagher et al. |
| 6,136,156 | A | 10/2000 | El-Shall et al. |
| 6,225,198 | B1 | 5/2001 | Alivisatos et al. |
| 6,239,355 | B1 | 5/2001 | Salafsky |
| 6,245,988 | B1 | 6/2001 | Gratzel et al. |
| 6,306,736 | B1 | 10/2001 | Alivisatos et al. |
| 6,322,901 | B1 | 11/2001 | Bawendi et al. |
| 6,413,489 | B1 | 7/2002 | Ying et al. |
| 6,501,091 | B1 | 12/2002 | Bawendi et al. |
| 6,878,871 | B2 | 4/2005 | Scher et al. |
| 2001/0046244 | A1 | 11/2001 | Klimov et al. |
| 2002/0040728 | A1 | 4/2002 | Yoshikawa |
| 2002/0071952 | A1 | 6/2002 | Bawendi et al. |
| 2002/0130311 | A1 | 9/2002 | Lieber et al. |
| 2002/0172820 | A1 | 11/2002 | Majumdar et al. |
| 2002/0192441 | A1 | 12/2002 | Kalkan et al. |
| 2003/0142944 | A1 | 7/2003 | Sundar et al. |
| 2003/0145779 | A1 | 8/2003 | Alivisatos et al. |
| 2003/0226498 | A1 | 12/2003 | Alivisatos et al. |
| 2004/0003838 | A1 | 1/2004 | Curtin |
| 2004/0026684 | A1 | 2/2004 | Empedocles et al. |
| 2004/0095658 | A1 | 5/2004 | Buretea et al. |
| 2005/0126628 | A1 | 6/2005 | Scher et al. |
| 2005/0150541 | A1 | 7/2005 | Scher et al. |
| 2005/0214967 | A1 | 9/2005 | Scher et al. |

FOREIGN PATENT DOCUMENTS

| | | |
|---|---|---|
| JP | 55-125681 | 9/1980 |
| JP | 57-153478 | 9/1982 |
| WO | WO-9400887 | 1/1994 |
| WO | WO-9404497 | 3/1994 |
| WO | WO-9529924 | 11/1995 |
| WO | WO-9610282 | 4/1996 |
| WO | WO-0217362 | 2/2002 |
| WO | WO-02080280 | 10/2002 |
| WO | WO-03054953 | 7/2003 |
| WO | WO-03084292 | 10/2003 |
| WO | WO-03085700 | 10/2003 |

OTHER PUBLICATIONS

Alivisatos et al., "Naturally aligned nanocrystals" Science (2000) 289:736.

Bjork, M.T. et al., "One-dimensional steeplechase for electrons realized" Nano Letters (2002) 2:86-89.

Cao, Y.W. et al., "Growth and properties of semiconductor core/shell nanocrystals witn InAs cores" J. Am. Chem. Soc. (2000) 122:9692-9702.

Colvin et al., "Light emitting diodes made from cadmium selenide nanocrystals and a semiconducing polymer" Nature (1994) 370:354-357.

Cui, Y. et al. "Doping and electrical transport in silicon nanowires" J. Phys. Chem. B (2000) 104(22):5213-5216.

Cui, Y. et al. "Diameter-controlled synthesis of single-crystal silicon nanowires" (2001) Appl. Phys. Letts. 78(15):2214-2216.

Dabbousi, B.O. et al., "Electroluminescence from CdSe quantum-dot/polymer composites" Appl. Phys. Lett (1995) 66(11):1316-1318.

Dabbousi, B.O. et al., "(cdSe)ZnS core-shell quantum dots: Synthesis and characterization of a sizze series of highly luminescent nanocrystallites" J. Phys. Chem. B (1997) 101(46):9463-9475.

Danek et al., "Synthesis of luminescent thin-film Cd/Se/ZnSe quantum dot composites using CdSe quantum dots passivated with an overlayer of ZnSe" Chem. Mater. (1996) 8(1):173-180.

Diehl, "Fraunhofer LUCOLEDs to replace lamps" III-Vs Rev. (1996) 10(1).

Duan, X. et al., "General synthesis of compound semiconductor nanowires" Adv. Mater. (2000) 12(4):298-302.

Empedocles, S. et al., "Photoluminescence spectroscopy of single CdSe nanocrystallite quantum dots" Phys. Rev. Lett (1996) 77(18):3873-3876.

Empedocles, S. et al., "Quantum-confined stark effect in single CdSe Nanocrystallite quantum dots" Science (1997) 278:2114-2117.

Greenham et al., "Charge separation and transport in conjugated-polymer/semiconductor-nanocrystal composites studied by photoluminescence quenching and photoconductivity" Phys. Rev. B (1996) 54(24):17628-17637.

Gudiksen, M.S. et al., "Diameter-selective synthesis of semiconductor nanowires" J. Am. Chem. Soc. (2000) 122:8801-8802.

Gudiksen, M.S. et al., "Synthetic control of the diameter and length of single crystal semiconductor nanowires" J. Phys. Chem. (2001) 105(19):4062-4064.

Gudiksen, M.S. et al., "Growth of nanowire superlattice structures for nanoscale photonics and electronics" Nature (2002) 415:617-620.

Guha et al., "Hybrid organic-inorganic semiconductor-based light-emitting dioes" J. Appl. Phys. (1997) 82(8):4126-4128.

Hines et al., "Synthesis and characterization of strongly luminescing ZnS-Capped CdSe nanocrystals" J. Phys. Chem. (1996) 100:468-471.

Hu et al., "Linearly polarized emission from colloidal semiconductor quantum rods" Science (2001)292:2060-2063.

Huynh et al., "CdSe Nanocrystal Rods/Poly(3-hexylthiophene) composite photovoltaic devices" Adv. Mater. (1999) 11(11):923-927.

Huynh et al., "Hybrid nanorod-polymer solar cells" Science (2002) 295(5564):2426-2427.

Jun et al., "Controlled synthesis of multi-armed CdS nanorod architectures using monosurfactant system" J. Am. Chem. Soc. (2001) 123:5150-5151.

Kitchin, M.R. "Theory of Semiconductor Heterostructures for Infrared Applications" Ph.D. Thesis, p. 8, Oct. 1999.

Kortan et al., "Nucleation and growth of CdSe on ZnS quantum crystallite seeds and vice versa, in inverse micelle media" J. Am Chem. Soc. (1990) 112:1327-1332.

Kuno et al., "The band edge luminescence of surface modified CdSe nanocrystallites: probing the luminescing state" J. Chem. Phys. (1997)106(23):9869-9882.

Lawless et al., "Bifunctional capping of CdS nanoparticles and bridging to TiO2" J. Phys. Chem. (1995) 99:10329-10335.

Lee et al., "Full color emission from II-VI semiconductor quantum dot-polymer composites" Adv. Mater. (2000) 12(15) :1102-1105.

Li et al., "Band gap variation of size- and shape-controlled colloidal CdSe quantum rods" Nanoletters (2001) 1:349-351.

Li et al., "Semiconductor nanorod liquid crystals" Nanoletters (2002) 2:557-560.

Liu, C. et al., "Sol-Gel synthesis of free-standing ferroelectric lead zirconate titanate nanoparticles" J. Am. Chem. Soc. (2001) 123(18):4344-4345.

Manna, L. et al., "Synthesis of soluble and processable rod-, arrow-, teardrop-, and tetrapod-shaped CdSe nanocrystals" J. Am. Chem. Soc. (2000) 122:12700-12706.

Manna, L. et al., "Epitaxial growth and photochemical annealing of graded CdS/ZnS shells on colloidal CdSe nanorods" J. Am. Chem. Soc. (2002) 124:7136-7145.

Matsumoto, "Preparation of monodisperse CdS nanocrystals by size selective photocorrosion" J. Phys. Chem. (1996) 100(32):13781-13785.

Morales, A.M. et al., "A laser ablation method for the synthesis of crystalline semiconductor nanowires" Science (1998) 279(9):208-211.

Murray et al., "Synthesis and characterization of nearly monodisperse CdE (E=S, Se, Te) semiconductor nanocrystallites" J. Am. Chem. Soc. (1993) 115:8706.

Nirmal et al., "Fluorescence intermittency in single cadmium selenide nanocrystals" Nature (1996) 383:802-804.

Peng, X. et al., "Epitaxial growth of highly luminescent CsDe/CdS core/shell nanocrystals with photostability and electronic accessibility" J. Am. Chem. Soc. (1997) 119(30):7019-7029.

Peng, X. et al., "Shape control of CdSe nanocrystals" Nature (2000) 404:59-61.

Puntes, V.F. et al., "Colloidal nanocrystal shape and size control: The case of cobalt" Science (2001) 291:2115-2117.

Scher, E.C. et al., "Shape control and applications of nanocrystals" Philosophical Transactions of the Royal Society London, Series A (2003) 361:241-257.

Schlamp et al., "Improved efficiencies in light emitting diodes made with CdSe (CdS) core/shell type nanocrystals and a semiconducting polymer" J. Appl. Phys. (1997) 82:5837-5842.

Urban, J.J. et al., "Synthesis of single-crystalline perovskite nanorods composed of varium titanate and strontium titanate" J. Am. Chem. Soc. (2002) 124(7):1186-1187.

Wu, Y. et al., "Block-by-block growth of single-crystalline Si/SiGe superlattice nanowires" Nano Letters (2002) 2(2):83-86.

Yun, W.S. et al., "Ferroelectric properties of individual barium titanate nanowires investigated by scanned probe microscopy" Nano Letters (2002) 2(2):447-450.

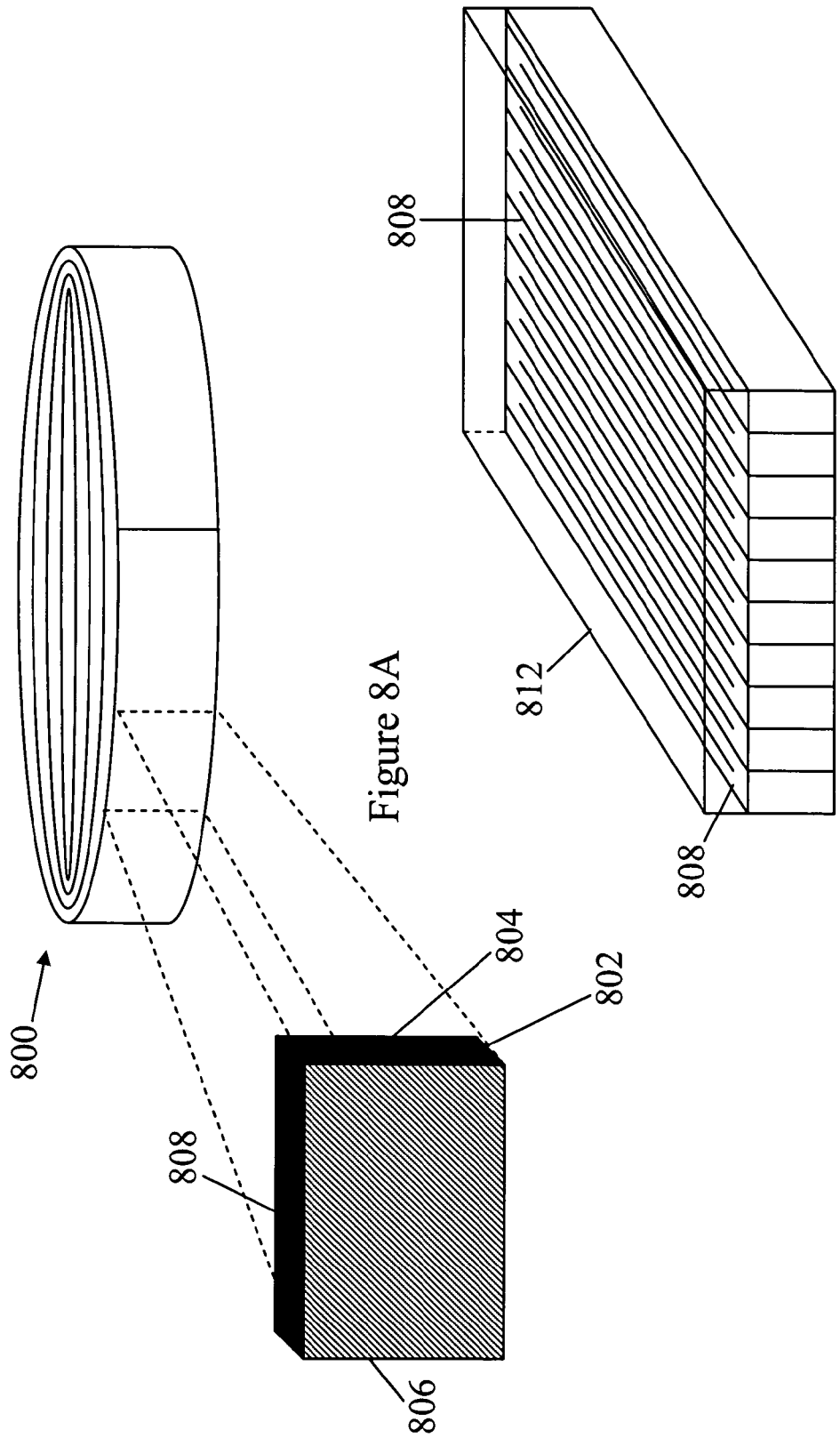

NANOSTRUCTURE AND NANOCOMPOSITE BASED COMPOSITIONS AND PHOTOVOLTAIC DEVICES

CROSS REFERENCE TO RELATED APPLICATIONS

This application is a continuation of U.S. patent application Ser. No. 11/008,315, filed Dec. 9, 2004, which is a divisional of U.S. patent application Ser. No. 10/656,802, filed Sep. 4, 2003, now U.S. Pat. No. 6,878,871, which claims priority to and benefit of U.S. Provisional Patent Application No. 60/408,722, filed Sep. 5, 2002, "NANOCOMPOSITES" Mihai Buretea et al., U.S. Provisional Patent Application No. 60/421,353, filed Oct. 25, 2002, "NANOCOMPOSITE BASED PHOTOVOLTAIC DEVICES" Erik Scher et al., and U.S. Provisional Patent Application No. 60/452,038, filed Mar. 4, 2003, "NANOCOMPOSITE BASED PHOTOVOLTAIC DEVICES" Erik Scher et al., each of which is incorporated herein by reference in its entirety for all purposes.

STATEMENT AS TO RIGHTS TO INVENTIONS MADE UNDER FEDERALLY SPONSORED RESEARCH AND DEVELOPMENT

Portions of this invention may have been made with United States Government support under National Reconnaissance Office grant NRO-03-C-0042. As such, the United States Government may have certain rights in the invention.

FIELD OF THE INVENTION

The present invention is in the field of nanostructures. More particularly, the invention provides devices, such as photovoltaic devices, comprising nanostructures, which optionally are part of a nanocomposite. Compositions comprising two populations of nanostructures of different materials are also features of the invention, as are methods of and systems for producing photovoltaic and other (e.g., layered) devices.

BACKGROUND OF THE INVENTION

Solar energy has long been looked to as a potential solution to the ever increasing energy needs of the planet's population. Increasing costs of mining fossil fuels, increased concerns over "greenhouse" emissions, and increasing instabilities in regions that house large reserves of fossil fuels have furthered interest in exploiting alternative energy strategies, including solar energy sources.

To date, solar energy conversion has generally relied upon either the direct harvesting of solar thermal energy, e.g., in heating applications, or in thermoelectric conversion, or through the direct conversion of photonic energy to electrical energy through the use of photovoltaic cells.

Current photovoltaic devices or cells employ thin layers of semiconductor material, e.g., crystalline silicon, gallium arsenide, or the like, incorporating a p-n junction to convert solar energy to direct current. While these devices are useful in certain applications, their efficiency has been somewhat limited, yielding conversion efficiencies, e.g. solar power to electrical power, of typically marginally better than 10%. While efficiencies of these devices have been improving through costly improvements to device structure, it is believed that physical limitations on these devices mean they will, at best, achieve a maximum efficiency of around 30%. For ordinary energy requirements, e.g., public consumption, the relative inefficiency of these devices, combined with their relatively high cost, when compared to other means of energy generation, have combined to inhibit the widespread adoption of solar electricity in the consumer markets. Instead, such systems have been primarily used where conventionally generated electricity is unavailable, e.g., in remote locations, terrestrial or otherwise, or where costs associated with bringing conventionally generated electricity, to a location where it is needed, more closely match the costs of photovoltaic systems.

Because of their construction and efficiency, currently marketed photovoltaics also come with a number of physical requirements. For example, because of their relative inefficiency, as well as their rigid construction, photovoltaic systems typically require adequate flat space that has appropriate sun exposure at all times, or at least during peak times, to meet the requirements for electricity for which the system is used.

Despite the issues with current photovoltaic technology, there is still a desire and a need to expand usage of solar electricity. In particular, there is generally a need for an improved photovoltaic cell that has one or more of: increased energy conversion efficiency, decreased manufacturing costs, greater flexibility and/or reasonable durability and/or longevity. The present invention meets these and a variety of other needs.

SUMMARY OF THE INVENTION

The invention includes nanocomposite based photovoltaic devices and their constituent elements, systems that incorporate such devices and elements, and methods of and systems for fabricating such devices and elements. For example, photovoltaic devices that include aligned nanostructures (e.g., nanocrystals) in a photoactive layer are an aspect of the invention. In a related aspect, devices comprising one or more types of nanostructures, including photovoltaic devices comprising multiple types of such structures, whether aligned or not, are another aspect of the invention. In either case, these devices can include or omit non-nanostructure elements in an active layer. For example, the nanostructures of such an active layer can be fused, partially fused or sintered to provide electron and/or hole carrying properties, e.g., between electrodes. Polymers, e.g., conductive polymers, can be combined with nanostructure elements in a photoactive layer, though such polymers are not required in many embodiments herein. Systems that comprise such devices, as well as methods and systems for fabricating such devices, are also an aspect of the invention. Active layer compositions, e.g., that can be used in photovoltaic and other devices, as well as related methods and systems, are an additional feature of the invention.

Accordingly, in a first general set of photovoltaic device embodiments, the invention provides photovoltaic devices. The devices include a first electrode layer and a second electrode layer. A first photoactive layer is disposed between the first and second electrode layers. The photoactive layer is disposed in at least partial electrical contact with the first electrode along a first plane, and in at least partial electrical contact with the second electrode along a second plane. The photoactive layer comprises material that exhibits a type II band offset energy profile, and includes a first population of nanostructures (e.g., nanocrystals) each having at least one elongated section oriented predominantly normal to at least the first plane.

The nanostructures can include any of a variety of structures, e.g., branched nanocrystals having more than one elongated segment, e.g., four elongated segments connected at a common apex, and arranged in a substantially tetrahedral geometry (e.g., nanotetrapods). The nanostructures can include materials that facilitate function in the photoactive layer, e.g., optionally including at least a portion that is comprised of a semiconductor selected from Group II-VI, Group III-V or Group IV semiconductors or alloys thereof. For example, the population of nanostructures can include nanocrystals that include one or more of: CdS, CdSe, CdTe, InP, InAs, ZnS, ZnSe, ZnTe, HgTe, GaN, GaP, GaAs, GaSb, InSb, Si, Ge, AlAs, AlSb, PbSe, PbS, or PbTe. The precise form of the nanostructure can vary, e.g., optionally including any of: a nanocrystal, a nanowire, a single-crystal nanostructure, a double-crystal nanostructure, a polycrystalline nanostructure, and/or an amorphous nanostructure. The population of nanostructures can include structures that include more than one subcomponent, e.g., such as nanocrystals that comprise a core of a first semiconductor material and a shell of a second (different) semiconductor material. For photovoltaic devices, the first and second semiconductor materials typically display a type-II band offset profile. Any of a variety of materials can be used to achieve this desirable property, including nanocrystals in which the core comprises CdSe and the shell comprises CdTe, or nanocrystals in which the core comprises InP and the shell comprises GaAs. These nanostructure features are generally applicable to the other device, method, composition and system embodiments noted below.

The photoactive layer optionally comprises a matrix, e.g., in which the nanocrystals are suspended or disposed. For example, the layer can include nanocrystals disposed in a conductive polymer matrix. The nanocrystals are optionally coupled to the polymer matrix, e.g., via a covalent chemical linkage. For example, in one embodiment, the chemical linkage comprises a ligand coupled at a first position to an outer surface of the nanocrystal and at a second position to the polymer matrix. The nanocrystals are optionally electrically coupled to the polymer matrix. Either the nanocrystals or the matrix (or both) can conduct holes or electrons. Furthermore, as noted in more detail herein, the matrix is optionally omitted from the devices herein, with nanostructures providing both electron and hole carrying properties to the electrodes (e.g., where two or more nanocrystal types are fused, partially fused or sintered together, optionally in the absence of any additional conductive (or other) polymer in the matrix).

The arrangement of nanostructures in the photoactive layer can be modified to enhance the activity of the photoactive layer. For example, in one aspect, one or more of the nanostructures or nanostructure types in the layer are positioned predominantly closer to the first electrode than to the second electrode (e.g., to facilitate electron or hole conductance to the relevant electrode). Similarly, the layer can include components that similarly facilitate properties of the layer, e.g., the layer can include a hole or electron blocking layer disposed between the photoactive layer and the first or second electrode. Similarly, the layer optionally includes a hole blocking layer disposed between the photoactive layer and the first electrode and an electron blocking layer disposed between the photoactive layer and the second electrode (e.g., to control flow of electrons or holes to the relevant electrode).

The nanostructures can include multiple distinct subtypes. For example, the population of nanostructures in the photoactive layer can include at least two different nanocrystal subpopulations, each nanocrystal subpopulation, e.g., having a different absorption spectrum. Thus, the different nanocrystal subpopulations optionally include different compositions, different size distributions, different shapes and/or the like.

In one aspect, the nanostructures in the photoactive layer collectively comprise at least two inorganic materials. For example, the nanostructures optionally comprise a core of a first inorganic material and a shell of a second inorganic material, and/or the photoactive layer can comprise at least two types of nanocrystals. Any of the nanostructures in the photoactive layer can optionally be fused, partially fused, and/or sintered. Where the nanostructures are fused, partially fused, and/or sintered, e.g., the cores of at least two adjacent nanostructures in the photoactive layer are optionally in at least partial electrical contact, and the shells of the at least two adjacent nanostructures, or at least two additional nanostructures, are optionally in at least partial direct electrical contact.

The photoactive layer optionally includes one or more sublayers. For example, the photoactive layer can include at least two active sublayers, with each of the active sublayers comprising a plurality of nanocrystals of at least one nanocrystal type. In one such embodiment, at least one of the at least two sublayers comprises an n-type sublayer and at least one of the two sublayers comprises a p-type sublayer, optionally meeting at one or more junction in the photoactive layer (e.g., a p-n or n-p-n or other junction). In an alternate related embodiment, the photoactive layer includes at least one sublayer that includes a blend of p and n nanocrystals.

In addition to the photoactive layer comprising sublayers, the overall device architecture can also be layered. For example, the device can include a plurality of photoactive layers (at least a second photoactive layer, and, optionally, more than two such layers). One or more electrode (and, typically, two electrodes) can be placed in electrical contact with any such photoactive layer of the device. For example, the device can include a third electrode layer, a fourth electrode layer and a second photoactive layer disposed between the third and fourth electrode layers. In this embodiment, the second photoactive layer is optionally disposed in at least partial electrical contact with the third electrode along a third plane, and in at least partial electrical contact with the fourth electrode along a fourth plane. Optionally, the second photoactive layer exhibits a type II band offset energy profile, and comprises a second population of nanostructures each having at least one elongated section oriented predominantly normal to at least the third plane, and having a different absorption spectrum from the first population of nanostructures. The third electrode layer, fourth electrode layer and second photoactive layer are optionally attached to, but electrically insulated from, the first electrode layer, second electrode layer and first photoactive layer.

Similar to the elements of the photoactive layer, the electrodes can also be selected to regulate overall device properties. For example, the electrodes can be made of any suitable conductive material, selected based upon charge carrying capabilities, environmental tolerance properties, or the like. For example, in one aspect, at least one of the electrodes optionally comprises aluminum or another metal. Furthermore, the properties of the electrodes or photoactive layers can be selected to provide a desired overall device property. For example, where a flexible photovoltaic device is desirable, the first and/or second electrodes or the photoactive layer can be selected to be flexible. Similarly, the first and/or second electrodes and/or photoactive layer optionally include additional device elements to protect the device from its working environment, and/or to enhance device properties. For example, in one aspect, any of the electrodes or the photoactive layer (or any combination thereof), can include a transparent layer (e.g., a transparent conductive layer). For example, in one aspect, the device includes a transparent support layer at least partially covering the first or second electrode, or at least partially covering the photoactive layer, or at least partially covering a combination thereof. Similarly, the device can include one or more sealing layers, e.g., the photoactive layer and/or one or more of the electrodes can comprise or be sealed within a sealing layer. For example, in one embodiment, the photoactive layer is hermetically sealed. In one example embodiment, the device comprises at least first and second sealing layers, the first and second sealing layers, the photoactive layer and first and second electrodes being sandwiched between the first and second sealing layers.

The overall architecture of the device can be selected based upon the use to which the device is to be put. For example, the overall device can comprise a planar or a non-planar architecture. For example, the device optionally comprises a convex architecture to enhance efficiency of the device in settings where convex architecture is desired. Similarly, in one embodiment, the first electrode layer, the photoactive layer and the second electrode layer are optionally oriented in a coiled architecture, or in a reciprocating stacked architecture.

In a related second set of embodiments, the nanocrystals are optionally oriented as noted in the embodiments above, but can, optionally, be oriented differently. That is, the nanostructures can be in any random or non-random orientation with respect to the various planes and electrodes noted above. In these embodiments, the nanostructures include at least one of the inorganic materials of the photovoltaic device, and optionally two or more such materials. The polymer components of the matrix of the photovoltaic layer noted above is an optional feature of these embodiments (the polymer can be retained or omitted in the photoactive layer).

Thus, in this second set of embodiments, a photovoltaic device is provided. The device includes a first electrode layer and a second electrode layer. A first photoactive layer is disposed between the first and second electrode layers. The photoactive layer is disposed in at least partial electrical contact with the first electrode along a first plane and in at least partial electrical contact with the second electrode along a second plane, wherein the photoactive layer comprises a first inorganic material and a second inorganic material different from the first inorganic material. In PV devices, the first and second inorganic materials typically exhibit a type II band offset energy profile. The photoactive layer includes a first population of nanostructures, which nanostructures comprise the first inorganic material, the second inorganic material, or a combination thereof.

All of the features noted above with respect to nanostructure type, shape and composition, electrode composition and configuration and device architecture apply to these embodiments as well. Any of the optional transparent/blocking/sealing layer embodiments of the first set of embodiments can be features of the second set of embodiments as well. Similarly, device architecture features noted above are applicable here as well. Unless noted otherwise, any feature of the first class of photovoltaic device embodiments noted above or otherwise herein can be applied to this second class of embodiments.

As above, the first inorganic material is optionally (and typically) a semiconductor, as is the second inorganic material. The materials can be any of those noted for the preceding embodiments. As with the preceding embodiments, the first population of nanostructures can include nanocrystals that comprise a core of the first inorganic material and a shell of the second inorganic material, e.g., any of those noted above. The nanocrystals are optionally fused, partially fused, and/or sintered, as in the preceding embodiments, providing for partial and/or direct electrical contact between nanostructure cores or shells as noted above.

In one such embodiment, the first population of nanostructures comprises nanocrystals comprising the first inorganic material, and the photoactive layer further comprises a second population of nanocrystals comprising nanocrystals which comprise the second inorganic material, e.g., wherein adjacent nanocrystals are in at least partial direct electrical contact with each other.

The nanocrystals of the first population and the nanocrystals of the second population are optionally intermixed in the photoactive layer. Alternately, the photoactive layer comprises at least a first sublayer and a second sublayer, wherein the first sublayer comprises the first population of nanocrystals and the second sublayer comprises the second population of nanocrystals.

As in the embodiments above, the photoactive layer optionally comprises at least two active sublayers, each of which optionally includes a plurality of nanocrystals of at least one nanocrystal type. As noted in the examples above, and as applicable to these embodiments as well, at least one of the at least two sublayers optionally comprises an n-type sublayer and/or a p-type sublayer, e.g., in any of the arrangements noted above (e.g., blended or separate p and/or n nanostructures, in blended or separate layers, optionally separated by one or more junctions).

For this set of embodiments, the photoactive layer can simply consist of nanocrystals, e.g., fused, partially fused or sintered nanocrystals. However, a polymer or matrix can also be included in the photoactive layer. For example, the photoactive layer can include a conductive or non-conductive polymer. The layer can include such a polymer matrix in which nanocrystals are disposed, e.g., in which nanocrystals of the first and/or second populations are electrically coupled to the polymer to provide for conductance of holes or electrons (e.g., to the electrodes of the device). However, such a polymer or other matrix component is not required, and the photoactive layer is optionally substantially free of any conductive and/or non-conductive polymer.

While the orientation of the first set of embodiments is not required in this second set of embodiments, the noted orientation is, optionally, a feature of the second set of embodiments as well. For example, the nanostructures of the first population can each have at least one elongated section oriented predominantly normal to at least the first plane. Similarly, the second population of nanostructures can display the same (or a different) orientation.

In addition to photovoltaic devices, the invention further provides compositions useful for constructing photovoltaic and other devices. These compositions can include or be comprised within photovoltaic or other devices (e.g., LEDs, dual crystal devices, etc). For example, a composition comprising a first population of nanostructures and a second population of nanostructures is provided. The first population comprises nanostructures comprising a first material, and the second population comprises nanostructures comprising a second material different from the first material.

As in the preceding embodiments, the nanostructures optionally include nanocrystals and/or nanowires. As in the preceding devices, the nanostructures can also comprise single-crystal nanostructures, double-crystal nanostructures, polycrystalline nanostructures, or amorphous nanostructures. Typically, the first material of the nanostructures is a first inorganic material and the second material is a second inorganic material. Optionally, the first material comprises a first semiconductor and the second material comprises a second semiconductor. For example, the first material optionally comprises an n-type semiconductor and the second material optionally comprises a p-type semiconductor. As in the photovoltaic devices noted above, the first and second materials can exhibit a type II band offset energy profile. However, in certain non-photovoltaic applications (e.g., LEDs), the first and second materials exhibit other energy profiles, e.g., a type I band offset energy profile. As in the photovoltaic devices noted above, adjacent nanostructures are optionally in at least partial (or direct) electrical contact with each other.

Optionally, the nanostructures of the first population and the nanostructures of the second population are in separate layers, or are intermixed. The populations can be located in one or more discrete or mixed regions, zones, layers, or the like. The composition can be formed into a film.

The composition optionally includes at least a first sublayer and a second sublayer. In such embodiments, the first sublayer optionally includes the first population of nanostructures and the second sublayer optionally includes the second population of nanostructures. In several applications, e.g., photovoltaic applications, the film or other composition is disposed between two electrode layers (or between additional electrode layers). As with the photovoltaic applications noted above, the nanostructures of the first and/or second populations are optionally fused, partially fused, and/or sintered (or not fused, partially fused or sintered).

The composition optionally includes a conductive polymer. For example, the composition optionally includes a polymer matrix in which nanostructures are disposed. Optionally, any feature of the nanostructures (surface, core, shell, etc.) are electrically coupled to the polymer. The polymer matrix can alternately or additionally be non-conductively coupled to the nanostructures. Alternately, the composition can be substantially free of conductive and/or non-conductive polymer.

In addition to the devices and compositions noted above, related methods and systems are also provided. In a first class of methods, methods of producing a photovoltaic device are provided. In the methods, a first planar substrate having a first conductive layer disposed thereon is provided. The first substrate is coated with a photoactive matrix that exhibits a type II band offset energy profile. The photoactive matrix includes at least a first population of elongated semiconductor nanostructures, comprising longitudinal axes, to provide a photoactive layer. The semiconductor nanostructures are oriented such that their longitudinal axes are predominantly oriented normal to the first planar substrate. A second conductive layer is laminated onto the photoactive layer.

Essentially any of the features of the devices and compositions noted above can be included in these methods. For example, the nanostructures optionally include a nanocrystal, a nanowire, a single-crystal nanostructure, a double-crystal nanostructure, a polycrystalline nanostructure, and/or an amorphous nanostructure. The nanostructures can be, e.g., any of those noted above, as can any other components of the matrix.

The method optionally includes providing a blocking layer on the first substrate prior to coating the first substrate with a photoactive matrix. Similarly, the method can include providing a blocking layer on the photoactive layer prior to laminating the second conductive layer onto the photoactive layer. One or more sealing layers can optionally be provided over opposing surfaces of the photovoltaic device in addition to first substrate and second conductive layer, whereby the one or more sealing layers hermetically seal the photovoltaic device.

A second class of methods of producing a photovoltaic device is also provided. In the methods, a first planar substrate having a first conductive layer disposed thereon is provided. The first substrate is coated with a composition that comprises a population of nanostructures to provide a photoactive layer. The nanostructures comprise a core of a first material and a shell of a second material different from the first material. The nanostructures are fused, partially fused, and/or sintered, and a second conductive layer is laminated onto the photoactive layer.

As in the preceding class of methods, essentially any of the features of the devices and compositions noted above can be included in these methods. For example, the nanostructures optionally include a nanocrystal, a nanowire, a single-crystal nanostructure, a double-crystal nanostructure, a polycrystalline nanostructure, and/or an amorphous nanostructure. The nanostructures can be, e.g., any of those noted above, as can any other components of the matrix. Typically, the first material is a first inorganic material and the second material is a second inorganic material. For example, the first material optionally includes a first semiconductor and the second material optionally includes a second semiconductor.

As in the preceding class of methods, the methods optionally include providing a blocking layer on the first substrate prior to coating the first substrate with the composition. Similarly, the methods optionally include providing a blocking layer on the photoactive layer prior to laminating the second conductive layer onto the photoactive layer. One or more sealing layers can be provided over opposing surfaces of the photovoltaic device, whereby the one or more sealing layers hermetically seal the photovoltaic device.

In a third class of method embodiments, methods of producing a layered device comprising a first population of nanostructures and a second population of nanostructures are provided. The first population includes nanostructures comprising a first material, and the second population comprises nanostructures comprising a second material different from the first material. The methods include providing a first substrate, and coating the first substrate with a composition comprising the first population of nanostructures to provide a first layer.

As in the preceding classes of methods, essentially any of the features of the devices and compositions noted above can be included in these methods. For example, the nanostructures optionally include a nanocrystal, a nanowire, a single-crystal nanostructure, a double-crystal nanostructure, a polycrystalline nanostructure, and/or an amorphous nanostructure. The nanostructures can be, e.g., any of those noted above, as can any other components of the matrix. Typically, the first material is a first inorganic material and the second material is a second inorganic material. For example, the first material optionally includes a first semiconductor and the second material optionally includes a second semiconductor.

Coating the first substrate with a composition comprising the first population of nanostructures optionally includes coating the first substrate with a composition comprising a mixture of the first and second populations of nanostructures. This provides a first layer in which the nanostructures of the first and second populations are intermixed.

The method optionally further includes coating the first substrate with a composition comprising the second population of nanostructures, to provide a second layer. For example, the second population of nanostructures can be disposed on the first substrate.

The first substrate can be planar or non-planar, e.g., any of the geometries noted for the devices above. The method can be used to produce a photovoltaic device, a luminescent device, or the like. A first conductive layer can be disposed on the first planar substrate and a second conductive layer can optionally be layered onto the first (or second) layer.

In the methods, a blocking layer is optionally provided on the first substrate prior to coating the first substrate with the composition comprising the first population of nanostructures. Similarly, a blocking layer can be provided on the first layer prior to laminating the second conductive layer onto the first (or second) layer. As in the methods above, one or more sealing layers can be provided over opposing surfaces of the device, whereby the one or more sealing layers optionally hermetically seal the device.

Systems for fabricating a photovoltaic device are also provided. For example, such a system can include a source of a first substrate layer, having a first conductive surface. The system can also include a conveyor system for conveying the first substrate layer. A source of a photoactive matrix can be fluidly coupled to a layer deposition system, the layer deposition system being at least partially disposed over the substrate conveyor system, to provide a layer of photoactive matrix on the first substrate layer. A source of a second conductive material is coupled to the layer deposition system positioned over the substrate conveyor system for depositing a layer of the second conductive surface material onto a layer of photoactive matrix deposited on the first substrate layer.

In one example embodiment, the source of first substrate material includes a rolled sheet of the first substrate material. The source of first substrate material optionally includes a source of first conductive material and a deposition system for depositing the first conductive material onto the first substrate material to provide the first conductive surface.

The layer deposition system can include, e.g., a doctor-blade, a screen printing system, an ink-jet printing system, a dip coating system, a sheer coating system, a tape casting system, a film casting system, or a combination thereof.

In a related class of embodiments, a system for fabricating a layered device is also provided. The system includes a first population of nanostructures and a second population of nanostructures. The first population comprises nanostructures comprising a first material, and the second population comprises nanostructures comprising a second material different from the first material. The system also includes a source of a first substrate layer; a conveyor system for conveying the first substrate layer; and, a source of a composition comprising the first and second populations of nanostructures, fluidly coupled to a layer deposition system, the layer deposition system being at least partially disposed over the substrate conveyor system, to provide a layer in which the nanostructures of the first and second populations are intermixed on the first substrate layer.

As in the devices, systems and methods above, the nanostructures can comprise nanocrystals or any of the other nanostructures noted herein or otherwise applicable. For example, the nanostructures can include nanocrystals and/or nanowires. The nanostructures can include, e.g., a single-crystal nanostructure, a double-crystal nanostructure, a polycrystalline nanostructure, and/or an amorphous nanostructure. Similarly, the first and second material can be any of those noted above, e.g., the first material can be a first inorganic material and the second material can be a second inorganic material. Optionally, the first substrate layer has a first conductive surface.

The system optionally includes a source of a second conductive material coupled to the layer deposition system, e.g., positioned over the substrate conveyor system for depositing a layer of the second conductive material onto the layer of intermixed nanostructures deposited on the first substrate layer.

As in the systems above, the source of first substrate material can optionally include a rolled sheet of first substrate material. Similarly, the source of first substrate material can further include a source of first conductive material and a deposition system for depositing the first conductive material onto the first substrate material to provide a first conductive surface. The layer deposition system can be any of those noted above.

In an additional related class of system embodiments, systems for fabricating layered devices comprising a first population of nanostructures and a second population of nanostructures, which first population comprises nanostructures comprising a first material, and which second population comprises nanostructures comprising a second material different from the first material, are provided. The system includes a source of a first substrate layer; a conveyor system for conveying the first substrate layer; a source of a first composition comprising the first population of nanostructures fluidly coupled to a layer deposition system, the layer deposition system being at least partially disposed over the substrate conveyor system, to provide a first layer; and, a source of a second composition comprising the second population of nanostructures fluidly coupled to the layer deposition system, the layer deposition system being at least partially disposed over the substrate conveyor system, to provide a second layer.

The system features noted for the preceding embodiments with respect to nanostructure types, first and/or second material types, conductive surfaces on the substrate layer(s), sources of first or second conductive materials, deposition systems for depositing the materials, use of rolled sheets, layering systems, etc. are applicable here as well.

BRIEF DESCRIPTION OF THE DRAWINGS

FIGS. 8A-8C schematically illustrate several alternate configurations of flexible or conformable photovoltaic devices according to the present invention.

DEFINITIONS

Figure 1:
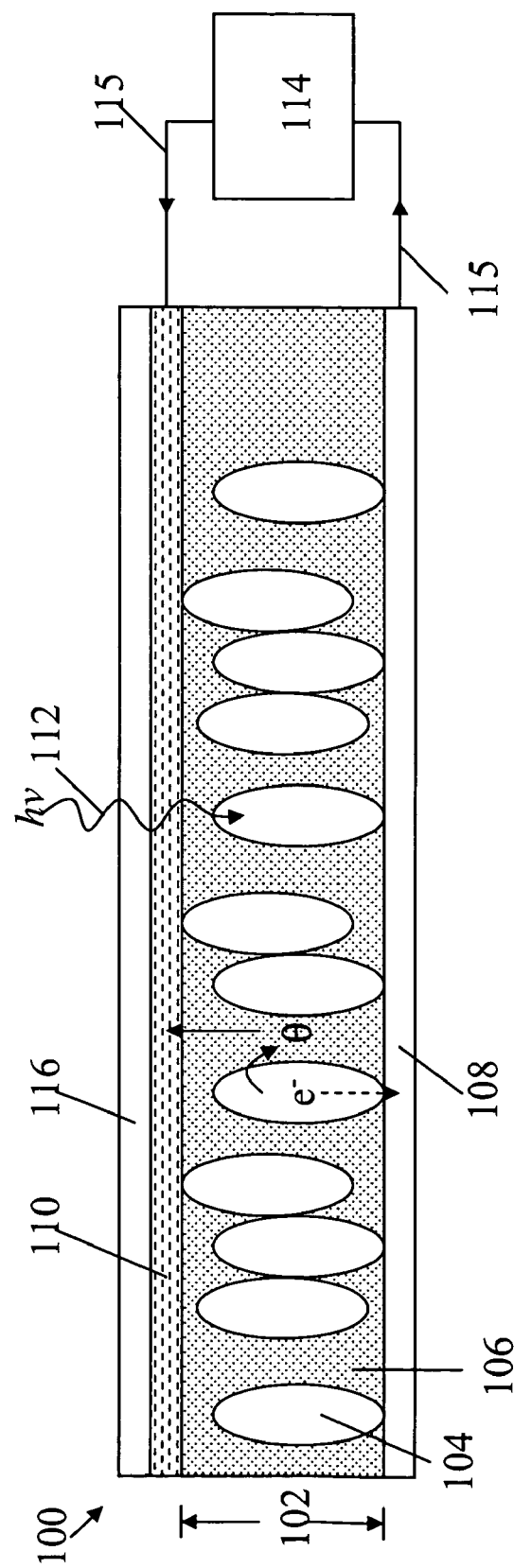
FIG. 1 is a schematic illustration of a cross sectional view of a simplified photovoltaic device according to the present invention.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of nanostructures, and the like.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

The terms "crystalline" or "substantially crystalline", when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanocrystal. Different regions within a heterostructure can comprise entirely different materials, or the different regions can comprise a base material (e.g., silicon) having different dopants or different concentrations of the same dopant.

A "nanocrystal" is a nanostructure that is substantially monocrystalline. A nanocrystal thus has at least one region or characteristic dimension with a dimension of less than about 500 nm, e.g., less than about 200 nm, less than about 100 nm, less than about 50 nm, or even less than about 20 nm. Nanocrystals can be substantially homogeneous in material properties, or in certain embodiments can be heterogeneous (e.g. heterostructures). The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. The nanocrystals can be fabricated from essentially any convenient material or materials. In one aspect, each of the three dimensions of the nanocrystal has a dimension of less than about 500 nm, e.g., less than about 200 nm, less than about 100 nm, less than about 50 nm, or even less than about 20 nm. Examples of nanocrystals include, but are not limited to, substantially spherical nanocrystals, branched nanocrystals, and substantially monocrystalline nanowires, nanorods, nanodots, quantum dots, nanotetrapods, tripods, bipods, and branched tetrapods (e.g., inorganic dendrimers).

A "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g. heterostructures). Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

A "nanowire" is a structure (typically, a nanostructure) that has one principle axis that is longer than the other two principle axes and that has an aspect ratio greater than about 10 (e.g., greater than about 20, greater than about 50, or greater than about 100, or even greater than about 10,000). The diameter of a nanowire is typically less than about 500 nm, preferably less than about 200 nm, more preferably less than about 150 nm, and most preferably less than about 100 nm, about 50 nm, or about 25 nm, or even less than about 10 nm or about 5 nm. The length of a nanowire is typically greater than about 100 nm, e.g., greater than 200 nm, greater than 500 nm, or even greater than 1000 nm. The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

DETAILED DESCRIPTION

Semiconductor nanocrystals, generally referred to as nanodots, nanorods, nanowires, etc., with their photoluminescent and electroluminescent properties have been the subject of a great deal of research into new labeling and luminescent display technologies.

In operation, when a semiconductor nanocrystal is exposed to light, the impact of photons of a given wavelength produces an excited state that is characterized by the displacement of an electron from its orbital. The resulting separated charges, an electron and an electron acceptor or hole, also together termed an "exciton," would then typically recombine. When the electron and hole recombine, they emit light at a wavelength characteristic of the energy released. By varying the characteristics of the material, one could adjust the wavelength of emitted light.

Thus, to date, nanorod and nanodot research and development has primarily exploited this charge recombination within these nanomaterials to take advantage of the luminescent results. However, it has been shown that by separating the charges in an exciton, e.g., an electron from a hole, one can exploit the resulting electrical potential, thus deriving electric current from optical energy. See, e.g., Huynh, et al., Science 295(5564):2426-2427 (2002), Huynh, et al., Adv. Materials 11(11):923 (1999), Greenham et al., Phys. Rev. B 54(24):17628-17637 (1996), and U.S. Pat. No. 6,239,355, each of which is hereby incorporated herein by reference in its entirety for all purposes. In particular, photovoltaic devices have been reported that exploit a nanocrystal composite active layer in the conversion of light energy to electrical energy.

The present invention provides additional photovoltaic devices comprising a nanocomposite active layer, as well as photovoltaic and other devices in which the active layer comprises nanocrystals that are not necessarily part of a composite. Related compositions, methods, and systems are also provided.

I. Active Layers

A. Nanocomposite Active Layers

One general class of embodiments provides photovoltaic devices in which the active layer comprises nanostructures (e.g., nanocrystals, nanowires, single-crystal nanostructures, double-crystal nanostructures, polycrystalline nanostructures, or amorphous nanostructures). Briefly, when light impinges upon the nanocrystal component of the active layer, it is absorbed by the nanocrystal creating an exciton within the nanocrystal. By conducting the electron away from the hole, one creates an electric potential that can be exploited. In the case of nanocomposite photoactive layers, this is accomplished by disposing the nanocrystal component in a conductive polymer matrix that is able to donate an electron to the nanocrystal (or conduct the hole away from the nanocrystal). Because the nanocrystals comprise semiconductive material, the charge mobility (movement of the electrons) in the nanocrystal component is sufficiently fast at conducting the electron away from the hole in the polymer matrix, so as to avoid recombination.

Once charges are separated, the electrons are selectively conducted through the active layer unidirectionally, e.g., out of the active layer through one electrode and back into the active layer through another electrode, providing useful current flow in the intervening circuit. Unidirectional conduction is also generally discussed in terms of movement of electrons in one direction and movement of holes in the other direction. The operation of one of these devices is schematically illustrated in FIG. 1. In particular, the general device structure 100 comprises an active layer 102 that is comprised of a material that displays or otherwise exhibits charge carrying properties having a type II band offset. As shown, the material meeting this criterion includes a nanocrystal component 104 and a polymer component 106. The active layer 102 is sandwiched between first and second electrodes 108 and 110, respectively. As shown, electrode 110 is disposed on a separate substrate 116, although the electrode(s) and substrate may be one integral unit. At least one of the electrodes, e.g., electrode 110, is provided as a transparent electrode or electrode layer. When light (as indicated by arrow 112) impinges upon the nanocrystal component 104, it creates an exciton which passes a hole (θ) into the polymer matrix 108, and conducts the electron (e⁻) along the nanocrystal 104 (as indicated by the dashed line). The electron is conducted to electrode 108 while the hole is carried to electrode 106. The resulting current flow, e.g., in the direction of arrows 115 is then exploited, e.g., in load/device 114.

Figure 2:
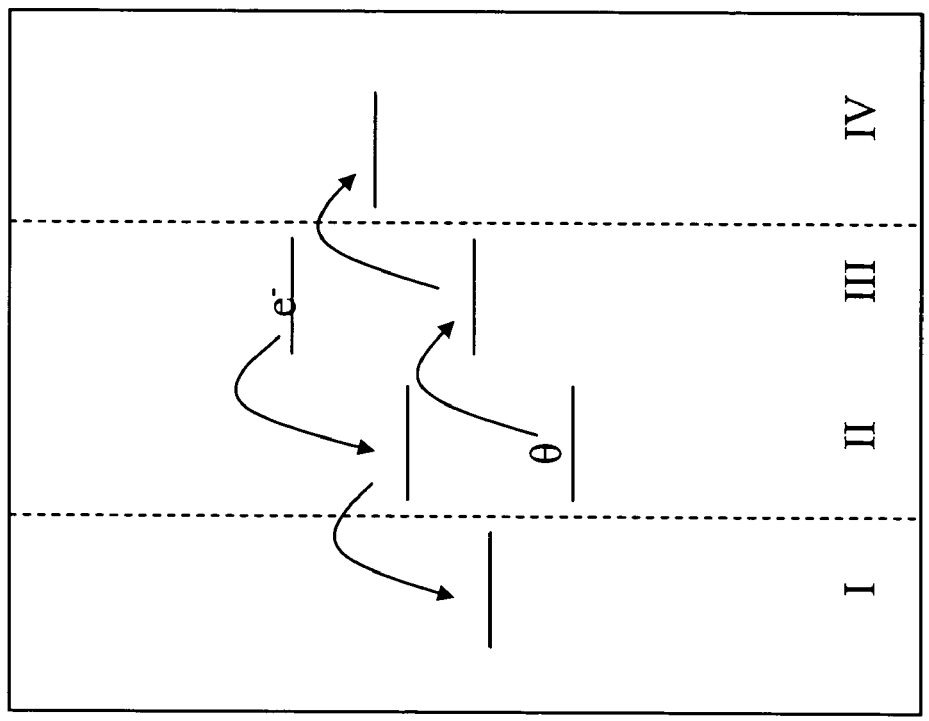
FIG. 2 schematically illustrates an energy diagram of elements of a nanocomposite photovoltaic device according to the present invention.

FIG. 2 schematically illustrates an energy diagram of the functioning of a nanocomposite photovoltaic device, as described herein, which dictates photoactivated charge separation, e.g., flow of holes toward one electrode and electrons toward the other electrode. By way of example, in certain cases, these energy plots show how electrons are retained in the nanocrystal and are conducted toward one electrode, while holes are transferred out the nanocrystal, e.g., into the polymer matrix, and conducted toward the other electrode. Shown is a plot of the work functions of the various components of the device, and the transfer of charges, e.g., electrons or holes among those components. The active layer is indicated in zones II and III, while the electrodes are shown in zones I and IV. As can be seen, the work functions of the various components are selected to obtain substantially unidirectional flow of electrons and holes, resulting in charge separation to the opposing electrodes. As can be seen, the active layer provides components that have a type II band offset, e.g., electrons and holes are flowing in opposite directions between zones II and III, achieving initial charge separation. The work functions for electron conduction and hole conduction for one component of the matrix, e.g., the nanocrystals and/or the core, are offset in the same direction, from those of the other component, e.g., the conducting polymer and/or the shell. Once separated, the work functions of the opposing electrodes further provide for charge separation, e.g., electrons flow preferentially to one electrode while holes flow to the other.

While prior researchers have demonstrated the basic functioning of a nanocomposite photovoltaic cell, the previously reported work shows that there is ample room for improvement of these devices, including increasing efficiency, e.g., from approximately 7%, increasing durability and manufacturability. In accordance with the present invention, a number of improvements are provided to the basic nanocomposite photovoltaic device that produces substantial improvements in efficiency across the range of light exposures, improvements in product robustness, as well as a number of other commercially valuable improvements.

The basic architecture of the photovoltaic devices of the invention is substantially as described with reference to FIG. 1. In particular, these devices typically include an active or photoactive layer 102 that is sandwiched between two electrically conductive or electrode layers 108 and 110. For ease of discussion, the electrodes are referred to as being planar or having a planar orientation. However as will be appreciated, electrodes and entire devices may take on a variety of shapes, including curved, corrugated, coiled or other decidedly non-planar architectures. As such, reference to the plane of the electrodes refers to the plane of the immediate region being referenced and may include the plane that is tangential to the actual electrode surface in this region. In one general class of embodiments, the photoactive layer is comprised of a nanocomposite material that provides for unidirectional electron movement, or current flow, upon exposure of the active layer to light. As used in the present invention, the nanocomposite typically includes a semiconductor nanostructure (e.g., nanocrystal) component that is disposed in a conductive matrix, and preferably a conductive polymer matrix, where the polymer matrix functions as a hole conductor while the nanostructures (e.g., nanocrystals) function as the electron conductor. With reference to FIG. 2, the nanocrystals would function as the zone II component, while the conducting polymer would be the zone III component.

1. Semiconductor Nanocrystals

Nanostructures, especially semiconductor nanocrystals, as noted above, have been described in great detail, previously. As used herein, semiconductor nanocrystals include a wide range of different materials that exist as nanoparticles, e.g., having at least one cross sectional dimension of less than about 500 nm, and preferably, less than 100 nm. These nanocrystals may be comprised of a wide range of semiconductive materials, including for example, group III-V, group II-VI and group IV semiconductors or alloys of these materials. In particularly preferred aspects, CdSe, CdTe, InP, InAs, CdS, ZnS, ZnO, ZnSe, PbSe, PbS, ZnTe, HgTe, GaN, GaP, GaAs, GaSb, InSb, Si, Ge, AlAs, AlSb or PbTe semiconductors or their alloys are used as at least a portion of the nanocrystal component.

Although generally described in terms of nanocrystals, in accordance with most preferred aspects of the invention, the nanocrystal component of the active layer will be comprised, at least in part, and preferably in substantial part, of elongated nanocrystals or nanorods, that include aspect ratios (length: diameter) of 5, 10 or greater, or three dimensional nanostructures that include nanorod-like components, e.g., four branched or tetrahedral structures also termed "nanotetrapods." The use of rod-like structures in place of substantially spherical structures, e.g., quantum dots, provides substantial advantages in terms of charge separation. In particular, and without being bound to a particular theory of operation, because of their aspect ratio, nanorods are able to separate an electron from a hole, e.g., the electron is conducted along the length of the rod, while the hole is transferred the short distance of the radius of the rod to the surrounding matrix. Particularly preferred nanorods and nanotetrapods and their methods of production are described in detail in, e.g., Peng et al, Nature 404(6773):59-61 (2000), Manna et al., J. Am. Chem. Soc. 122(51):12700-12706 (2000), and Manna et al., J. Am. Chem. Soc. 124(24):7136-7145 (2002), each of which is incorporated herein by reference in its entirety for all purposes.

The semiconductor nanocrystals may optionally comprise additional elements to enhance their function within the active layer. For example, nanocrystals may be dye sensitized to increase light absorption and/or charge injection into the nanocrystal component. Examples of such dyes include those described in U.S. Pat. No. 6,245,988, published PCT Application Nos. WO 94/04497 and 95/29924, each of which is incorporated herein by reference in its entirety for all purposes, where ruthenium based dyes are provided in conjunction with crystalline components to enhance light absorption and charge injection.

In a number of preferred aspects, the nanocrystal component will comprise a nanoheterostructure. In particular, in certain preferred aspects, the nanocrystal component will comprise a core-shell structure where the core portion of the crystal comprises a first material, and is overlaid with a coating or shell of another material. Core-shell nanostructures have been described previously (see, U.S. Pat. Nos. 6,207,229 and 6,322,901, incorporated herein by reference in their entirety for all purposes). Particularly preferred are core-shell nanocrystals, e.g., nanorods, having a type-II band offset between the core and the shell, where the core transports one portion of the exciton, e.g., the electrons, while the shell transports the other, e.g., holes. As a result, the core-shell nanorod efficiently maintains charge separation and carries out charge conduction, both as to electrons and holes. With reference to FIG. 2, the core-shell nanocrystals described herein would function as both the zone II and zone III component of the active layer. By utilizing these materials, one can substantially, if not entirely, eliminate the need for the conducting polymer component of the active layer of any device. Examples of core-shell materials that possess such type 2 offsets include, e.g., CdSe-CdTe nanorods and InP-GaAs nanorods. Alternatively, longitudinal heterostructures may also be included as the nanocrystal component of the active layer, e.g., those with one or more heterojunctions along the longitudinal axis of the crystal, e.g., as described in Published PCT Application Nos. WO 02/080280 and WO 02/17362, the full disclosures of which are hereby incorporated herein by reference in their entirety for all purposes.

Use of core-shell nanocrystals provides additional advantages of being able to eliminate conductive polymers from the active layer. In particular, the inclusion of conductive polymers in carrying out the charge separation operation is believed to result in some lost efficiency associated with transfer of charge from the crystal to the polymer. This may be addressed as described elsewhere herein, e.g., through the inclusion of linking chemistries between crystal and polymer. More concerning in the use of conductive polymers is their susceptibility to oxidation, photooxidation, or other environmental conditions, which can severely limit their durability in many commercial applications if not hermetically sealed. Because inorganic nanocrystals do not have these sensitivities, their use provides for drastic simplification of packaging and manufacturing methods.

2. Polymer Matrix

A variety of different conductive matrices are useful as the supporting and conductive matrix of the active layer. Conductive polymers are generally described in T. A. Skatherin (ed.), Handbook of Conducting Polymers I, which is incorporated herein by reference in its entirety for all purposes. Examples of preferred conductive polymer matrices include, e.g., poly (3-hexylthiophene)(P3HT), poly[2-methoxy, 5-(2'-ethylhexyloxy)-p-phenylene-vinylene] (MEH-PPV), poly(phenylene vinylene)(PPV), and polyaniline. Because of the application of the devices described herein, it will be appreciated that preferred polymer matrices will be light stable, and depending upon the packaging of the devices, oxygen stable as well.

One aspect of active layers where it is believed that efficiencies can be increased is in the charge separation between a semiconductor nanocrystal and a conductive polymer matrix in an active layer. In particular, it is believed that at least some of the inefficiencies of nanocomposite photovoltaic active layers derive from recombination of excitons within the nanocrystal. Accordingly, without being bound to a particular theory of operation, it is expected that by providing a more efficient conduction of holes from the nanocrystal to the polymer matrix, or among the layers of a core-shell nanocrystal, one could obtain a consequent improvement in efficiency of the overall device.

In accordance with certain aspects of the present invention, charge separation efficiency is at least partially addressed by coupling the outer surface or shell of the nanocrystal to the polymer matrix. The coupling comprises an electrically conductive coupling that provides a more direct route of conduction from the nanocrystal to the polymer matrix. Typically, such couplings may comprise any of a variety of covalent chemical, ionic, hydrophobic/hydrophilic interactions between the polymer and the nanocrystal, either directly or through one or more linking molecules. Examples of useful polymer/nanocrystal linkages include, e.g., modifying the polymer side chains, e.g., polymers like P3HT, PPV or their derivatives, to directly bind nanocrystal side chains, i.e., adding phosphonic acid groups, phosphine oxides, phosphine, amine, thiol or other chemistries that will couple to the passivated, partially passivated, and/or unpassivated atoms (e.g., to the cation or anion groups) present on a nanocrystal surface. As noted above, and as should be readily apparent, where the electron carrier and hole carrier are associated as the same structure, e.g., as a core-shell nanocrystal, charge separation efficiencies would be further expected to increase, which may be used in conjunction with or in certain preferred aspects, in lieu of a chemical linkage to a polymer matrix. Examples of useful approaches to surface chemistries for linkage to polymers or otherwise to enhance charge injection and/or extraction from nanocrystals are described in substantial detail in Provisional U.S. Patent Application No. 60/452,232, filed Mar. 4, 2003, and U.S. patent application Ser. No. 10/656,910, filed on Sep. 4, 2003, which are incorporated herein by reference in their entirety for all purposes.

Alternatively, ligands may be coupled to the outer surface of the nanocrystal via conventional chemistries, e.g., as described elsewhere herein and in, e.g., Provisional U.S. Patent Application No. 60/392,205, filed Jun. 27, 2002, which is incorporated herein by reference in its entirety for all purposes. The ligand is then coupled at a second position to the polymer matrix, e.g., via conventional linking chemistries.

Alternative or additional polymer matrix modifications may also be provided in addition to or instead of those described above, including doping of conducting polymers with charged groups and/or controlled oxidation of the conducting polymer to permit better charge conduction through the polymer.

3. Active Layer Configuration

As noted above, conduction of electrons is much more rapid through the semiconductor nanocrystals (or other semiconductor nanostructures) than through the surrounding polymer matrix. In cases where an electron is conducted or hops from one crystal to another, there is a consequent loss in energy associated with that hopping. By minimizing losses associated with electron hopping, one can improve the efficiency of the overall device. In order to minimize hopping, therefore, it is desirable to provide as direct a conductive path through the active layer, as possible, e.g., a path with fewer required crystal to crystal hops. In the case of spherical or near spherical nanocrystals, this is best accomplished by providing the nanocrystal component as substantially a monolayer disposed on one electrode. While this provides an advantage in charge conduction, it carries the disadvantage of substantially reduced light absorption from a single thin layer of nanocrystals.

The use of nanorods or nanotetrapods, however, provides significant advantages in this respect. In particular, because these nanorods and nanotetrapods have elongated sections and maintain quantum confinement in one dimension, they provide both increased light absorption, e.g., they absorb well along the entire length of the rod) and a longer conductive path, and thus have the potential for more efficient charge conduction. By orienting this longer conductive path to bridge the space between the electrodes, e.g., normal to the plane of the electrodes, one can further provide a more direct and longer conductive path for electrons.

Accordingly, in preferred aspects, the active layers described herein employ nanostructures that provide an elongated conductive path, which path is oriented predominantly normal to the plane of the two opposing electrodes of the device. As noted above, this can be accomplished by providing elongated nanorods that are oriented such that their longitudinal axes are predominantly normal to the plane of the electrodes. By "oriented predominantly normal to the plane" is generally meant that the average longitudinal dimension of the collection of nanorods within the active layer is oriented more normal to the plane of the two electrodes than would be the case of a completely randomly oriented collection of nanorods.

In preferred aspects, the nanorod component of the active layer is even more stringently oriented, such that at least 50% of the nanorods in a collection of nanorods are oriented such that they include elongated sections that have their longitudinal axes oriented within 45° of normal to the plane of the electrodes. In more preferred aspects, at least 80% of the nanorods in the active layer are oriented such that they have elongated sections that have their longitudinal axes are within 45° of normal to the plane of the electrodes, and in still further aspects, at least 90% or even 95% of the nanorods are so oriented. In some embodiments, the orientation may be more toward normal, with the greater percentage of rods, e.g., the various percentages set forth above, being oriented such that their longitudinal axes are within at least 30° of normal to the plane of the electrodes, and in some cases oriented within 20° or even 15° or less to the plane of the electrodes.

In one aspect, the present invention provides compositions such as photoactive layers having aligned and/or arranged nanostructure elements, as well as methods for preparing aligned and/or arranged nanostructures. Any of a number of nanostructures (or combination of nanostructures) can be used in the compositions and methods of the present invention, including, but not limited to, nanodots, nanospheres, nanorods, nanowires, nanoribbons, nanotetrapods, various branched structures (e.g., dendrimer branching structures), quantum dots, nanodots, and the like.

In one aspect, the present invention provides compositions having a plurality of non-randomly oriented nanostructures in a matrix, e.g., in a PV device, e.g., as part or all of a photoactive layer. The non-randomly oriented nanostructures can include both regularly-ordered arrays of nanostructures, as well as irregularly-ordered arrangements of nanostructures.

In another aspect, the present invention provides compositions having an array of nanostructures in a matrix, e.g., in a photoactive layer, in which the plurality of nanostructure members are non-randomly arranged. Optionally, the nanostructures are non-randomly oriented in addition to being non-randomly arranged.

In a further embodiment, the compositions of the present invention have two or more matrix layers, each member layer comprising a plurality of non-randomly oriented nanostructures and/or non-randomly arranged nanostructures. The member nanostructures in the matrix layers can be aligned with respect to the member nanostructures in an adjacent matrix layer (e.g., where the photoactive layer or the overall device comprises more than one active layer), or not aligned.

In any case, methods of orienting nanorods in a polymer matrix include electric field assisted orientation of nanorods, e.g., applying an electric field to cause magnetic rods to orient in a desired direction, in a polymer matrix which optionally can be hardened to maintain the orientation. Alternatively, rods may be disposed in a polymer matrix which can then be stretched to cause the rods to align in the direction of stretching. In particular, stretching of polymer materials aligns the polymer strands in the direction of stretching which tends to force similar alignment of any nanorods disposed in the polymer material.

Alternatively, aligned rods may be grown substantially in situ as a field of oriented structures that are subsequently integrated into the polymer matrix and active layer. Methods of fabricating such fields of aligned nanostructures are described, in e.g., Published U.S. Patent Application Nos. 2002/0172820 and 2002/0130311, the full disclosures of which are hereby incorporated by reference in their entirety for all purposes.

In alternative preferred aspects, alignment of rods may be achieved through the exploitation of liquid crystal phases of the nanocrystals. For example, CdSe nanorods have been observed to exhibit liquid crystalline phases under certain conditions. Once in these liquid crystal phases, one can readily align such crystals by applying a small electric field as is commonly done with organic liquid crystals, e.g., in display applications.

Alternatively, self assembly methods may be employed that rely on differential treatment of one or both ends of a nanorod, as compared to the side surfaces. In preferred aspects, the rods would be aligned through the incorporation in the matrix of liquid crystals. For example, one could provide a hydrophilic moiety on an end of a nanorod while providing hydrophobic sides, in order to force rods to orient along an aqueous-organic interface with the end extending into the aqueous phase while the side surfaces remained in an organic phase. Curing of the organic phase, e.g., a polymer, would then secure the rods in position. Relatedly, one could provide layers of matrix material that have different affinities for other chemical moieties that are selectively deposited on different portions of rods or wires. For example, a rod may be provided with a first chemical moiety at one end, e.g., that portion that has a wurtzite structure, while a different chemical moiety is coupled to the other end or the remaining portion of the rod or wire. By depositing the rods or wires into a matrix that includes an interface where one side of the interface has a higher affinity for the first chemical moiety and the other side of the interface has a higher affinity for the second chemical moiety, it may result in self orientation of the rods across the interface.

In another alternative method, nanorods may be aligned and oriented by coupling a linker molecule, e.g., an organic surfactant, that bind strongly to only one end of the nanorods. The other end of the surfactant is then functionalized to bind selectively to one electrode. By way of example, in the case of CdSe, alkyl phosphonic acids bind more strongly to the 00-1 face of nanorods than any other face. This selective binding is then taken advantage of in coupling the bound end to an electrode, e.g., the cathode, of a photovoltaic device.

In one general class of embodiments, the photoactive layer includes compositions having a plurality of selectively-oriented nanostructures in which the members nanostructures are associated with one or more alignment ligands (which can be components of a matrix in which the nanostructures are embedded, or can simply be directly attached to the nanostructures). In one example, a first alignment ligand on a first member nanostructure interacts with a second alignment ligand associated with an adjacent member nanostructure, thereby selectively-orienting the plurality of nanostructures. These ligands can include any that ordinarily interact with one another, e.g., as in avidin-biotin, antibody-antibody ligand, aptamer-aptamer binding moiety, complementary nucleic acids, interactive chemical moieties, and/or the like.

In any case, in one embodiment of the present invention, a plurality of selectively-oriented nanostructures are provided in the photoactive layer. The nanostructures are selectively aligned by providing a plurality of nanostructures comprising a first set of nanostructures associated with a first alignment ligand and a second set of nanostructures associated with a second alignment ligand, and interacting the first alignment ligand on a first nanostructure with the second alignment ligand on a second adjacent nanostructure, to selectively orient the plurality of nanostructures.

In another related embodiment, a plurality of non-randomly oriented or non-randomly dispersed nanostructures in a matrix in the photoactive layer are prepared by providing a plurality of nanostructures and a matrix composition, in which the matrix composition includes one or more matrix components that interact to form a plurality of receiving structures capable of accommodating the nanostructures. The composition is heated and cooled in the presence of the plurality of nanostructures, thereby preparing the plurality of non-randomly oriented or non-randomly dispersed nanostructures in the matrix.

In any case, aligned and/or organized nanostructures can be used in any of a number of devices and applications, including, but not limited to, various photovoltaic devices, optoelectronic devices (LEDs, nanolasers), light collectors, and the like.

In certain preferred aspects, branched nanorods, and particularly, branched nanorods having a tetrahedral geometry, e.g., nanotetrapods, are used as the electron conducting component of the active layer. In the case of nanotetrapods, virtually any orientation will provide an effective conductive path that is oriented substantially or predominantly normal to the plane of the electrodes, as described above, and thus no orientation process or step is required. In particular, because nanotetrapods have four branches arranged in a tetrahedral architecture, virtually any rotational disposition of the structure will provide a reasonably direct conductive path through the active layer. For a nanotetrapod, no branch or component of a single nanotetrapod structure will be more than 60° from normal to the electrode, and at least one component or branch will be within 30° of normal to the plane of the electrode. Thus, in terms as described for nanorods, nanotetrapods include at least one elongated section that has a longitudinal dimension or axis that is within 30° of normal.

Figure 3B:
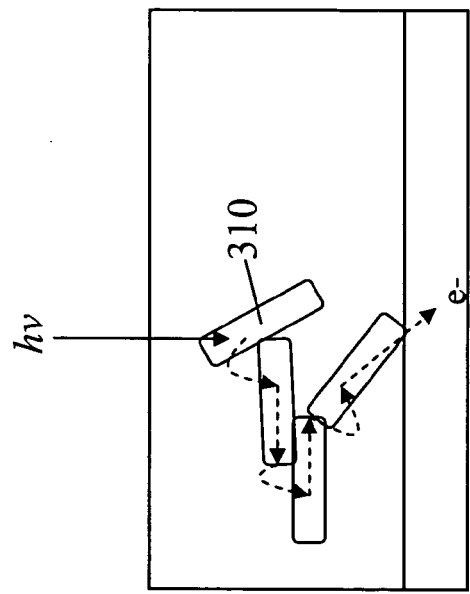
FIG. 3A-3D schematically illustrates a comparison of different nanocomposite compositions and configurations in an active layer, and electron conduction therethrough.
Figure 3D:
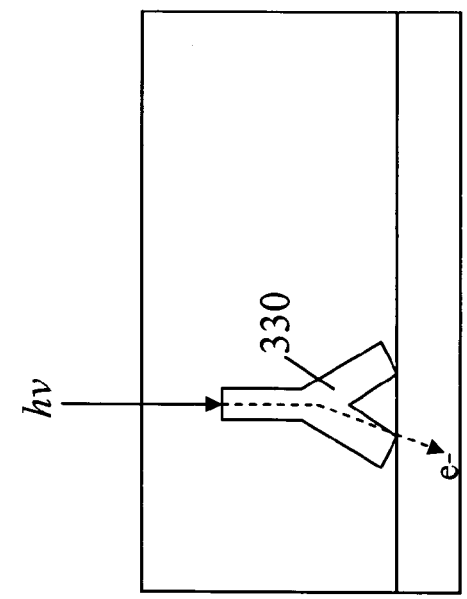
Figure 3A:
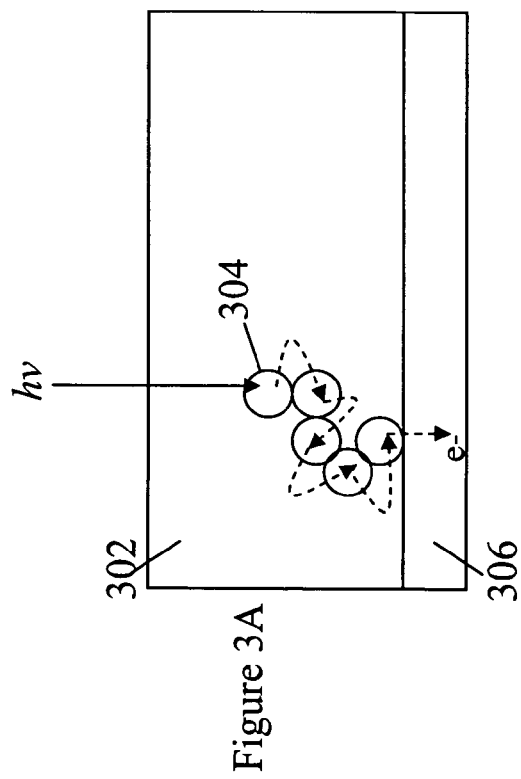
Figure 3C:
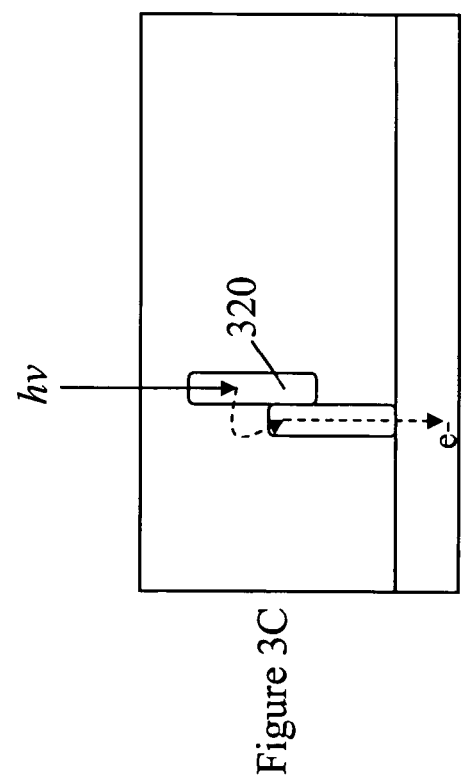

FIG. 3 schematically illustrates a comparison of electron conduction in active layers that include spherical nanocrystals (FIG. 3A), non-oriented nanorods (FIG. 3B), oriented nanorods (FIG. 3C), and nanotetrapods (FIG. 3D). As shown in FIG. 3A, an active layer 302 that employs spherical nanocrystals 304 necessarily requires multiple hopping incidents (dashed arrows show exemplary potential conduction path) for an electron to conduct from the middle of the active layer 302 to the electrode 306. Similarly, for nonoriented rods 310, e.g., as shown in FIG. 3B, although electrons are conducted for longer distances without hopping, where those distances are not properly oriented, conduction to an electrode 306 can again involve multiple hopping events. As can be seen in FIGS. 3C and 3D, however, oriented nanorods 320, or relatedly, nanotetrapods 330, are capable of providing a direct or nearly direct conductive path from the active layer to the electrode 306.

Although described in terms of active layers that include either spherical nanocrystals, nanorods or nanotetrapods, it will be appreciated that devices of the present invention may include active layers that are comprised of multiple different types of nanostructures, e.g., nanorods and nanotetrapods, nanorods and spherical or nonelongated nanocrystals, or nonelongated nanocrystals and nanotetrapods, or all three types of nanocrystals. Similarly, devices may include multiple active layers sandwiched between multiple electrode layers, where each active layer is made up of homogeneous or heterogeneous mixtures of nanostructure types, and where each layer is the same as or different from at least one other layer.

Figure 4B:
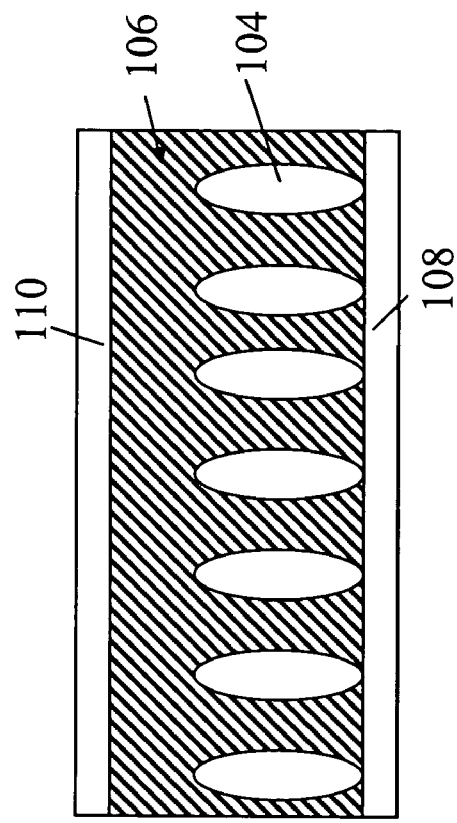
FIG. 4A-4B schematically illustrates a cross sectional view of positioned nanocrystals in an active layer.
Figure 4A:
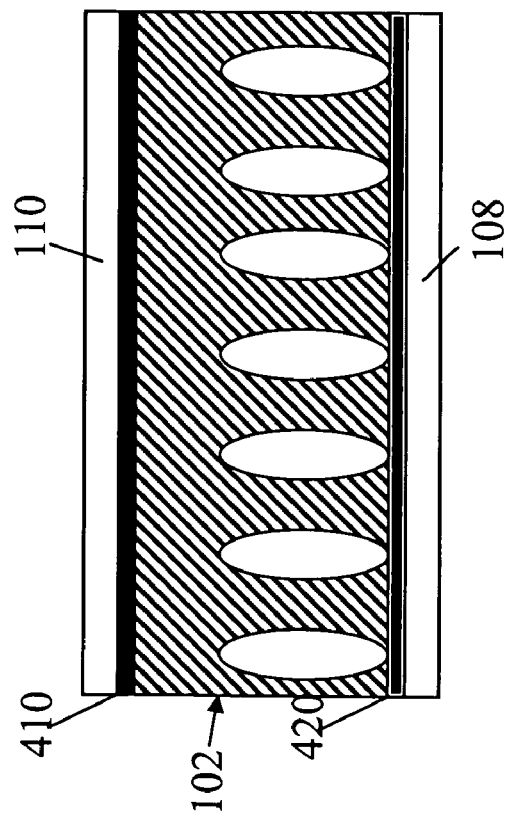

As noted above, operation of the photovoltaic devices of the invention relies upon unidirectional current flow through the active layer, also referred to as "charge separation." In the nanocomposite based devices of the invention, unidirectional conduction may be accomplished by a number of different means. For example, in certain cases, blocking layers are employed on the respective electrodes to function as electrical check valves to maintain charge separation. In particular, a blocking layer is provided proximal to the first electrode that blocks electron conduction to the first electrode, while not blocking hole conduction to (or electron conduction from) that first electrode). In contrast, another different blocking layer is provided proximal to the second electrode that permits electron conduction to the second electrode but blocks hole conduction to (or electron conduction from) that second electrode. An example of a device architecture that includes such blocking layers is shown in FIG. 4A. As shown, the device includes the same components as shown in FIG. 1. In addition, however, disposed adjacent the one electrode 110, is an electron blocking layer 410, e.g., a layer that is less or not conductive to electrons, but permits the passage of holes to electrode 110. A hole blocking layer 420 (e.g., that blocks the passage of holes but permits passage of electrons from the active layer to the electrode) is then disposed between the active layer 102 and the other electrode 108. Although described as having two blocking layers, in this aspect of the invention, it is possible that only one blocking layer might be provided, e.g., just an electron blocking layer on one electrode or just a hole blocking layer on the other electrode. A variety of different types of blocking layers are known in the art and include, e.g., hole blocking layers, e.g., $TiO_2$, electron blocking layers, e.g., crosslinked poly(3-hexylthiophene) (P3HT), carboxylated P3HT, crosslinked TPA, and the like. Although described as a blocking layer for holes or electrons, it will be appreciated that this generally refers to relative conductivity, e.g., a material that is a better hole conductor than it is an electron conductor would be referred to as an electron blocking layer in accordance with the invention, and vice versa. Because of the application of the devices of the invention, blocking layers that are highly stable to exposure to light, oxygen and water, e.g., $TiO_2$, may be particularly preferred.

Alternatively or additionally, one can enhance unidirectional current flow in the devices of the invention by providing the nanocrystal (or other nanostructure) component positioned proximal to one electrode, versus the other. An example of this type of structure is illustrated in FIG. 4B. In particular, as shown, the active layer 102 includes a nanorod component 104 (as shown) and a polymer matrix component 106 (hatched) disposed between first and second electrodes 108 and 110, respectively. As shown in FIG. 4B, however, the nanorods 104 are positioned closer to the lower or first electrode 108 than to second electrode 110. By providing the electron conducting nanocrystal component 104 predominantly closer to one electrode 108 than to the other electrode 110, one enhances electron conduction to the first electrode 108 over the second electrode 110 which is partially insulated by the polymer matrix 106. Similarly, by a greater concentration of polymer proximal to the second electrode 110, one reduces the potential for electron flow to the second electrode from the active layer, e.g., from nanorods 104. For extra measure, one can also provide one or more blocking layers in addition to providing for positioned nanostructures, e.g., electron blocking layer 410 and hole blocking layer 420. In the case of the nanocrystal component, the phrase "predominantly more proximal to one electrode" than the other electrode means that at least 60% of the nanocrystals in the active layer are disposed closer (in terms of distance from any portion of the nanocrystal to any portion of the electrode) to one electrode than to the other. Preferably, at least 80% or even 90% or more of the nanocrystals are closer to one electrode than to the other.

One method of preferentially locating nanocrystals (or other nanostructures) closer to one electrode than the other is to sequentially deposit the active layer components onto one electrode. In particular for example, one can deposit a portion of the active layer matrix that includes the nanocrystals onto the first electrode, e.g., electrode 108. A second layer of just the matrix material, e.g., the conductive polymer, is then deposited over the portion that contains the nanocrystals. This will result in an increased proportion of nanocrystals closer to one electrode (108) than the other (110). Alternatively, one could perform a modified version of this type of operation in reverse. In particular, one could first deposit a layer of conducting polymer onto one electrode (110). A second layer of conducting polymer/nanocrystal matrix, is then deposited over the pure polymer layer, and the other electrode (108) is deposited onto the active layer. In order to provide direct connection of the nanocrystals to the other electrode (108), one may optionally or additionally then preferentially dissolve the polymer layer away from the matrix, e.g., dissolving 1%, 10%, 20%, 50% or more of the polymer in the matrix layer, to expose the nanocrystal components of the matrix. The second electrode (108) is then deposited upon the exposed nanocrystals to provide such crystals in direct contact with the second electrode, but sufficiently distant from the first electrode, by virtue of the pure polymer layer that was first deposited thereon.

In additional or alternative arrangements, one may enhance charge separation through the use, as noted previously, of core-shell nanorods, where the core and shell have a type II band offset, e.g., conducting one charge carrier through the core and the other through the shell, thereby functioning in the same way as a nanocrystal-conducting polymer composite active layer. In such cases, the core-shell nanocrystal functions as the active layer component as shown in zones II and III in FIG. 2. By using a core-shell nanocrystal as the active layer, one obviates the need for the conductive polymer contribution to the operation of the device, e.g., the shell (or core, depending upon composition) functions in the same manner as the polymer, e.g., as the hole carrier. In such cases, one may eliminate the conductive polymer from the active layer. In a further modification of the above described selective etching process for positioning nanocrystals into electrical contact with one electrode, one could optionally or additionally etch away a portion of a shell material, in the case where an active layer of core/shell nanocrystals are used. The ensuing deposition of the electrode (108) layer would then provide the core of the nanocrystal, e.g., the electron conducting portion, in direct electrical contact with electrode 108, further enhancing the efficiency of the electron conductance. Similarly, where the core material is a hole conductor, the reverse operation, e.g., depositing electrode 110 over the exposed core, would be done. Because cores and shells are typically of relatively substantially dissimilar materials, one can adopt an etchant composition and/or process, e.g., timing, concentrations of etchant, etc., that selectively etches the shell without excessively etching the core.

In a related aspect, an active layer may be fabricated by providing core-shell nanocrystals as a component of the active layer, e.g., as described above. However, in optional additional aspects, the core-shell nanocrystal component of the active layer is sintered or otherwise agglomerated or linked together physically and/or electrically. The resulting active layer is then comprised of an amorphous matrix that includes regions of shell material substantially evenly dispersed in the matrix with regions of core material. These regions retain their functionality as one of the hole or electron conductor, in the active layer. Further, because they originate from nanocrystals, the amorphous matrix appears to be substantially homogeneous, at the micron scale, while actually being heterogeneous at the nanoscale level. While advantageous from some perspectives, e.g., charge separation and conduction, sintered active layers may be less flexible than polymer composite active layers, and thus may be preferred for certain applications and less preferred for others. Sintering is typically accomplished using well known thermal sintering methods whereby the nanocrystal layer is heated to a temperature at which agglomeration occurs, but is still typically below the melting point of the nanocrystal materials. For such sintered active layers, it may be desired to provide the nanocrystals as a substantially contiguous monolayer within the active layer, which is not always necessary for polymer composite active layers.

B. Inorganic Active Layers

One class of embodiments provides photovoltaic devices in which the active layer comprises one or more populations of nanostructures collectively comprising two inorganic materials (e.g., one material that functions as a hole conductor and one that functions as an electron conductor). These photovoltaic devices are similar to those described above, although the nanostructures are not necessarily nonrandomly oriented and/or are not necessarily part of a nanocomposite. Thus, in one class of embodiments, the photovoltaic device comprises a first electrode layer, a second elector layer, and a first photoactive layer disposed between the first and second electrode layers. The photoactive layer is disposed in at least partial electrical contact with the first electrode along a first plane and in at least partial electrical contact with the second electrode along a second plane. The photoactive layer comprises a first inorganic material and a second inorganic material different from the first inorganic material; the first and second inorganic materials exhibit a type II band offset energy profile. In addition, the photoactive layer comprises a first population of nanostructures, which nanostructures comprise the first inorganic material, the second inorganic material, or a combination thereof.

In a preferred class of embodiments, the first and second inorganic materials are semiconductors. Essentially any pair of semiconductor materials with a type II band offset can be used. For example, the first inorganic material can comprise a first semiconductor selected from the group consisting of: a Group II-VI semiconductor, a Group III-V semiconductor, a Group IV semiconductor, and an alloy thereof. Similarly, the second inorganic material can comprise a second semiconductor, different from the first semiconductor, selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe.

The nanostructures can be any of a variety of nanostructures. For example, the nanostructures can comprise a single-crystal nanostructure, a double-crystal nanostructure, a polycrystalline nanostructure, or an amorphous nanostructure. The nanostructures can comprise, e.g., nanocrystals, nanorods, nanowires, nanotubes, branched nanocrystals, nanotetrapods, tripods, bipods, nanodots, quantum dots, nanoparticles, branched tetrapods, or the like, or a combination thereof (e.g., nanorods and nanotetrapods, or nanorods and spherical or nonelongated nanocrystals, among many other possible combinations).

As noted above, an active layer can be fabricated by providing core-shell nanocrystals. Thus, in one class of embodiments, the first population of nanostructures comprises nanocrystals that comprise a core of the first inorganic material and a shell of the second inorganic material. For example, as noted previously, the first and second inorganic materials can be essentially any two semiconductors with an appropriate type II band offset; for example, the core can comprise CdSe and the shell CdTe, or the core can comprise InP and the shell GaAs.

As noted above, the nanocrystals are optionally fused, partially fused, and/or sintered. In one class of embodiments, the cores of at least two adjacent nanocrystals are in at least partial direct electrical contact and the shells of at least two adjacent nanocrystals are in at least partial direct electrical contact. The cores of one or more nanocrystals are optionally in at least partial direct electrical contact with the first electrode or the second electrode; similarly, the shells of one or more nanocrystals are optionally in at least partial direct electrical contact with the opposite electrode.

Figure 10:
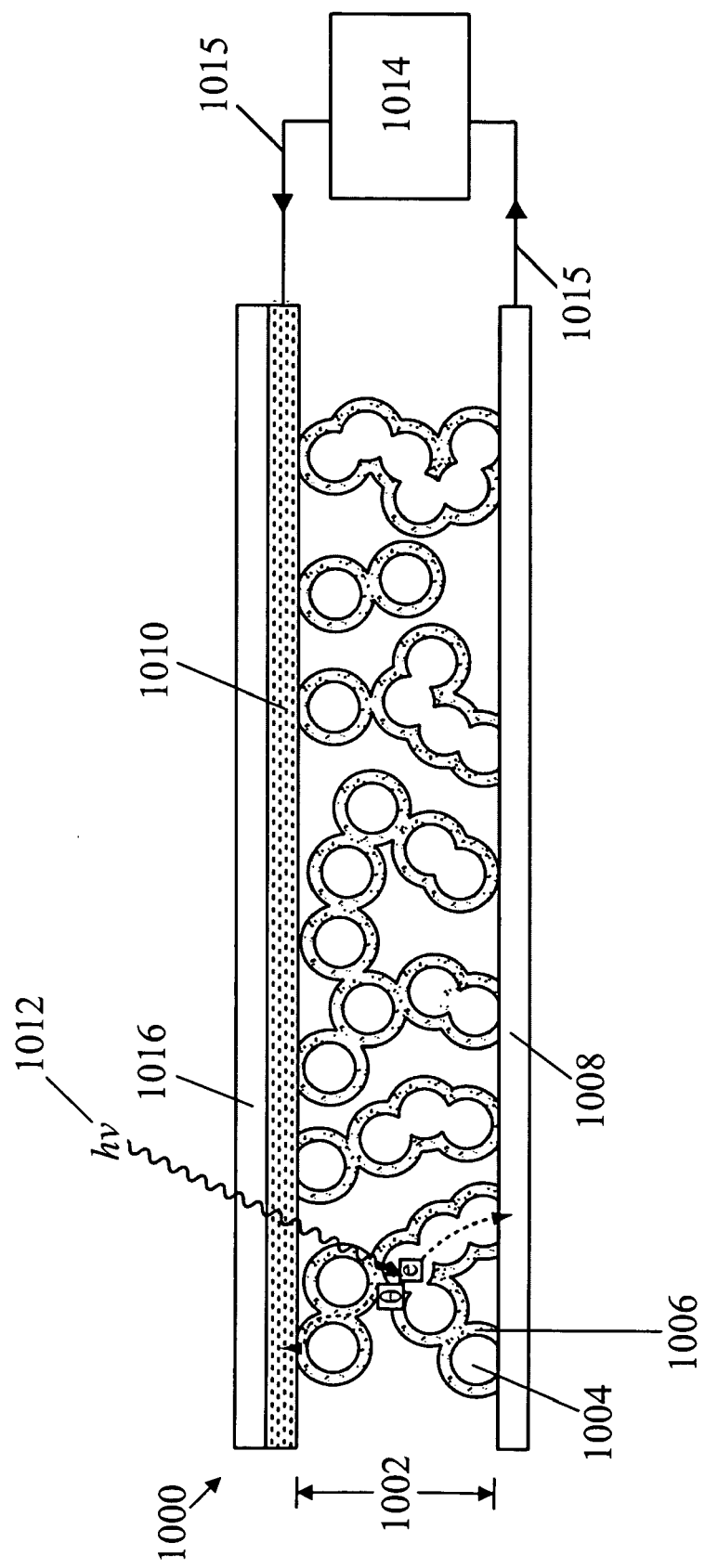
FIG. 10 is a schematic illustration of a cross sectional view of a simplified photovoltaic device according to the present invention.

Operation of an example embodiment in which adjacent core-shell nanocrystals are fused, partially fused, or sintered such that the cores and/or shells of adjacent nanocrystals are in at least partial direct electrical contact is schematically illustrated in FIG. 10. In this example, the general device structure 1000 comprises an active layer 1002. As shown, the active layer includes a nanocrystal component having a core 1004 and a shell 1006, the materials of which exhibit a type II band offset. The active layer 1002 is disposed between first electrode 1008 and second electrode 1010 (which is illustrated disposed on a separate substrate 1016, although the electrode(s) and substrate can be a single integral unit). When light (arrow 1012) passes through the transparent electrode and substrate in this example, it impinges upon the nanocrystal, creating an exciton. The hole (Θ) is conducted by the shell material 1006 to electrode 1010, while the electron (e−) is conducted through the core material 1004 to electrode 1008. The resulting current flow in the direction of arrows 1015 is then exploited in load/device 1014. In this example, the cores of some nanocrystals are in at least partial direct electrical contact with the electrode 1008, while the shells of other nanocrystals are at least partial direct electrical contact with the electrode 1010. As an alternative example, the nanocrystals can comprise a hole conducting core and electron conducting shell, in which example the cores would contact electrode 1010 and the shells electrode 1008.

In a related class of embodiments, the photoactive layer comprises two populations of nanostructures. The first population of nanostructures comprises nanocrystals comprising the first inorganic material, and a second population of nanocrystals comprises nanocrystals which comprise the second inorganic material. As in the preceding embodiments, the first and second materials can be, for example, any two semiconductors with a type II band offset. For example, the first inorganic material can comprise CdSe and the second CdTe, or the first inorganic material can comprise CdS and the second CdTe, or the first inorganic material can comprise CdS and the second ZnSe. Adjacent nanocrystals in the photoactive layer are typically in at least partial direct electrical contact with each other. The nanocrystals of the first and/or second populations are optionally fused, partially fused, and/or sintered (or not fused, partially fused, and/or sintered).

In one class of embodiments, the nanocrystals of the first population and the nanocrystals of the second population are intermixed in the photoactive layer. The nanocrystals of the two populations can be uniformly mixed, or an increased proportion of one population can be closer to one electrode while an increased proportion of the other population is closer to the other electrode.

Figure 11:
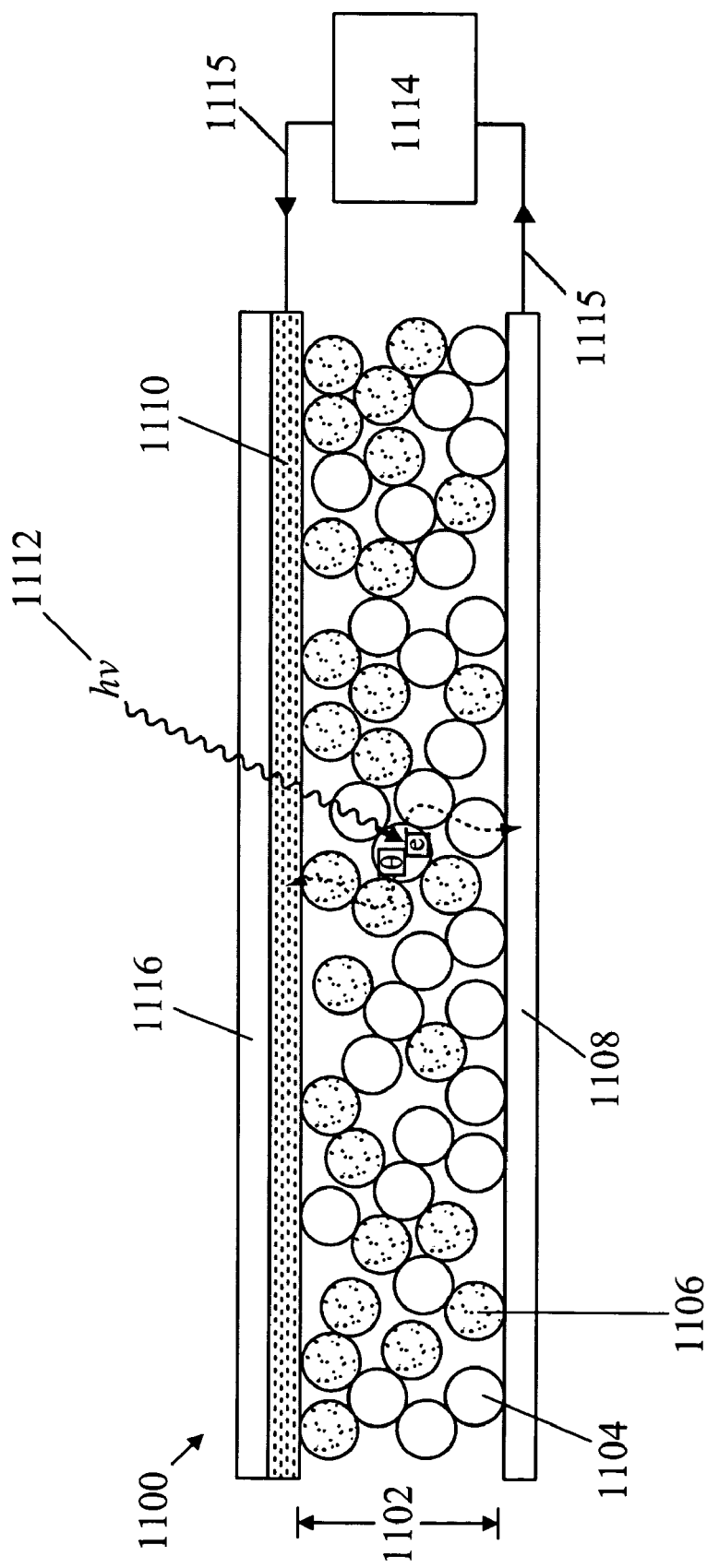
FIG. 11 is a schematic illustration of a cross sectional view of a simplified photovoltaic device according to the present invention.

Operation of an example embodiment in which the photoactive layer comprises two intermixed nanocrystals populations is schematically illustrated in FIG. 11. In this example, the general device structure 1100 comprises an active layer 1102. As shown, the active layer includes one population of nanostructures 1106 comprising a hole conducting inorganic material and another population of nanostructures 1104 comprising an electron conducting inorganic material, where the two materials exhibit a type II band offset. Adjacent nanocrystals are in at least partial direct electrical contact with each other. The active layer 1102 is disposed between first electrode 1108 and second electrode 1110 (which is illustrated disposed on a separate substrate 1116, although the electrode(s) and substrate can be a single integral unit). When light (arrow 1112) passes through the transparent electrode and substrate in this example, it impinges upon the nanocrystal, creating an exciton. The hole (Θ) is conducted by the nanocrystals 1106 to electrode 1110, while the electron (e−) is conducted through the nanocrystals 1104 to electrode 1108. The resulting current flow in the direction of arrows 1115 is then exploited in load/device 1114.

In another class of embodiments, the nanocrystals of the two populations are segregated into layers rather than being intermixed. In these embodiments, the photoactive layer comprises at least a first sublayer and a second sublayer, wherein the first sublayer comprises the first population of nanocrystals and the second sublayer comprises the second population of nanocrystals.

Figure 12:
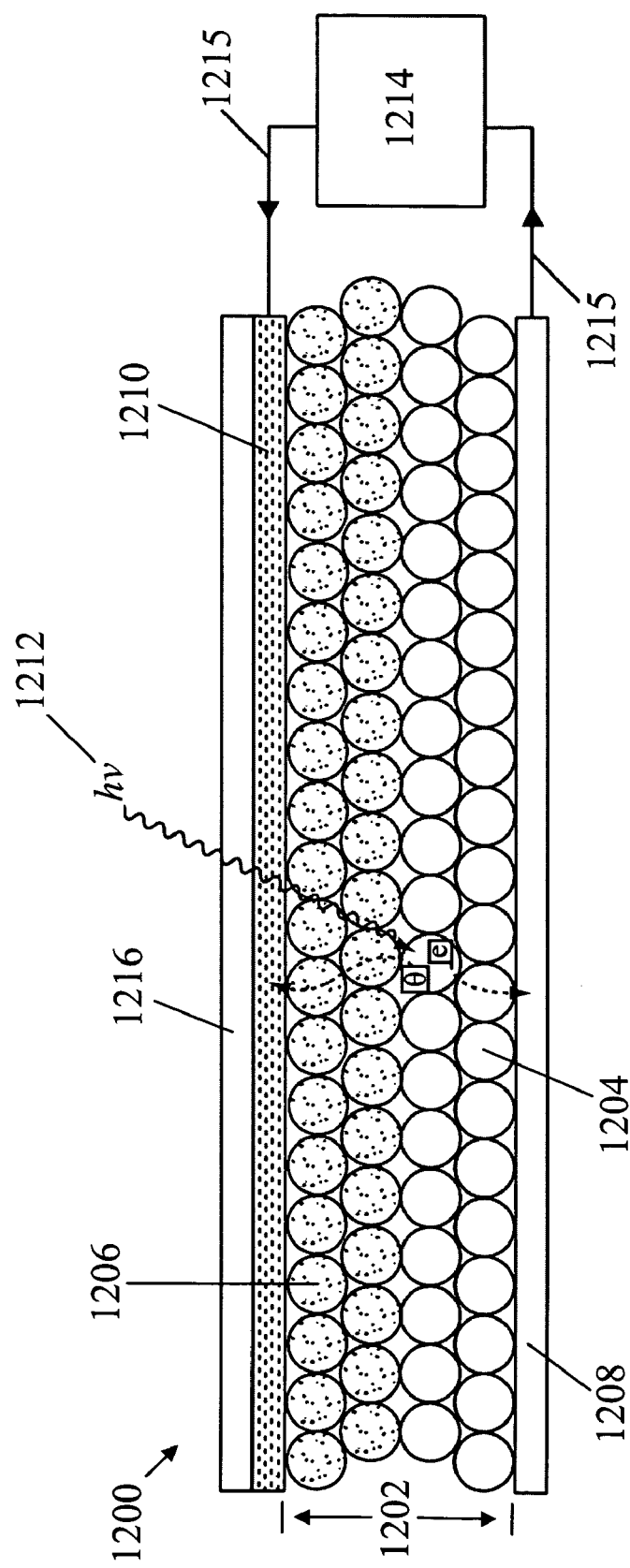
FIG. 12 is a schematic illustration of a cross sectional view of a simplified photovoltaic device according to the present invention.

Operation of an example embodiment in which the photoactive layer comprises two sublayers is schematically illustrated in FIG. 12. In this example, the general device structure 1200 comprises an active layer 1202. As shown, the active layer includes one sublayer comprising one population of nanostructures 1206 and another sublayer comprising a population of nanostructures 1204. The nanostructures 1206 comprise a hole conducting inorganic material, while the nanostructures 1204 comprise an electron conducting inorganic material, where the two materials have a type II band offset. The active layer 1202 is disposed between first electrode 1208 and second electrode 1210 (which is illustrated disposed on a separate substrate 1216, although the electrode(s) and substrate can be a single integral unit). When light (arrow 1212) passes through the transparent electrode and substrate in this example, it impinges upon the nanocrystal, creating an exciton. The hole (Θ) is conducted by the nanocrystals 1206 to electrode 1210, while the electron (e−) is conducted through the nanocrystals 1204 to electrode 1208. The resulting current flow in the direction of arrows 1215 is then exploited in load/device 1214.

As noted, the photoactive layer can comprise at least two active sublayers, e.g., wherein each of the active sublayers comprises a plurality of nanocrystals of at least one nanocrystal type. In one class of embodiments, at least one of the at least two sublayers comprises an n-type sublayer and at least one of the two sublayers comprises a p-type sublayer; optionally, the photoactive layer comprises a junction between the p-type sublayer and the n-type sublayer. At least one of the sublayers is typically nanocrystalline. In another class of embodiments, the photoactive layer comprises a blend of p and n nanocrystals. For example, the photoactive layer can comprise at least one sublayer comprising a blend of p and n nanocrystals.

As noted above, use of inorganic nanostructures to provide both hole and electron conducting materials in the active layer can obviate the need for a conductive polymer component in the active layer. Thus, although in some embodiments the photoactive layer further comprises a conductive polymer (e.g., a conductive polymer matrix in which the nanostructures are disposed), in alternative embodiments, the photoactive layer is substantially free of conductive polymer. In certain embodiments, the photoactive layer also includes a nonconductive polymer or other binder (e.g., a nonconductive polymer matrix in which the nanostructures are disposed, uniformly or nonuniformly). It will be appreciated that preferred polymers will be light stable, and, depending on the packaging of the devices, oxygen stable. Suitable conductive polymers include, e.g., those noted in the above embodiments; suitable nonconductive polymers include, e.g., polyamide and PMMA. The photoactive layer optionally includes components included to modify the properties of the nanostructures, e.g., surface chemistries and ligands such as those described above.

The nanostructures can be, but are not necessarily, nonrandomly oriented in the photoactive layer. Thus, in one class of embodiments, the nanostructures of the first population (and/or the second population, if present) each has at least one elongated section oriented predominantly normal to at least the first plane. Such orientation can be achieved, e.g., as described above, e.g., for nanorods. As one example, the nanostructures can comprise branched nanocrystals having more than one elongated segment, e.g., branched nanocrystals comprising four elongated segments connected at a common apex and arranged in a substantially tetrahedral geometry.

As described above, blocking layers can be employed to maintain charge separation. Thus, in one class of embodiments, the photovoltaic device also includes a hole or electron blocking layer disposed between the photoactive layer and the first or second electrode. For example, the photovoltaic device can include a hole blocking layer disposed between the photoactive layer and the first electrode and an electron blocking layer disposed between the photoactive layer and the second electrode.

As will be discussed in greater detail below, for certain applications, the photovoltaic device is desired to be flexible or otherwise conformable. Thus, at least one of the first and second electrodes are optionally flexible, as is the photoactive layer. The device is optionally hermetically sealed and can assume any of a variety of architectures.

The composition and/or size of nanocrystals can be selected, e.g., to optimize the absorption spectrum of the active layer, as discussed in greater detail in the following section. Thus, the first population of nanostructures optionally comprises at least two different nanocrystal subpopulations, each nanocrystal subpopulation having a different absorption spectrum. For example, the different nanocrystal subpopulations can comprise different compositions and/or the different nanocrystal subpopulations can comprise nanocrystals having different size distributions.

The photovoltaic device optionally comprises at least a second photoactive layer, e.g., optimized for absorption of a wavelength range distinct from that of the first photoactive layer. Thus, in one class of embodiments, the photovoltaic device further comprises a third electrode layer, a fourth electrode layer, and a second photoactive layer disposed between the third and fourth electrode layers. The second photoactive layer is disposed in at least partial electrical contact with the third electrode along a third plane and in at least partial electrical contact with the fourth electrode along a fourth plane. The second photoactive layer comprises a second population of nanostructures having a different absorption spectrum from the first population of nanostructures (typically, a second population of inorganic nanocrystals, similar to that described for the first photoactive layer). The third electrode layer, fourth electrode layer and second photoactive layer are attached to, but electrically insulated from, the first electrode layer, second electrode layer and first photoactive layer.

C. Tuning Nanostructure Absorption

Figure 5:
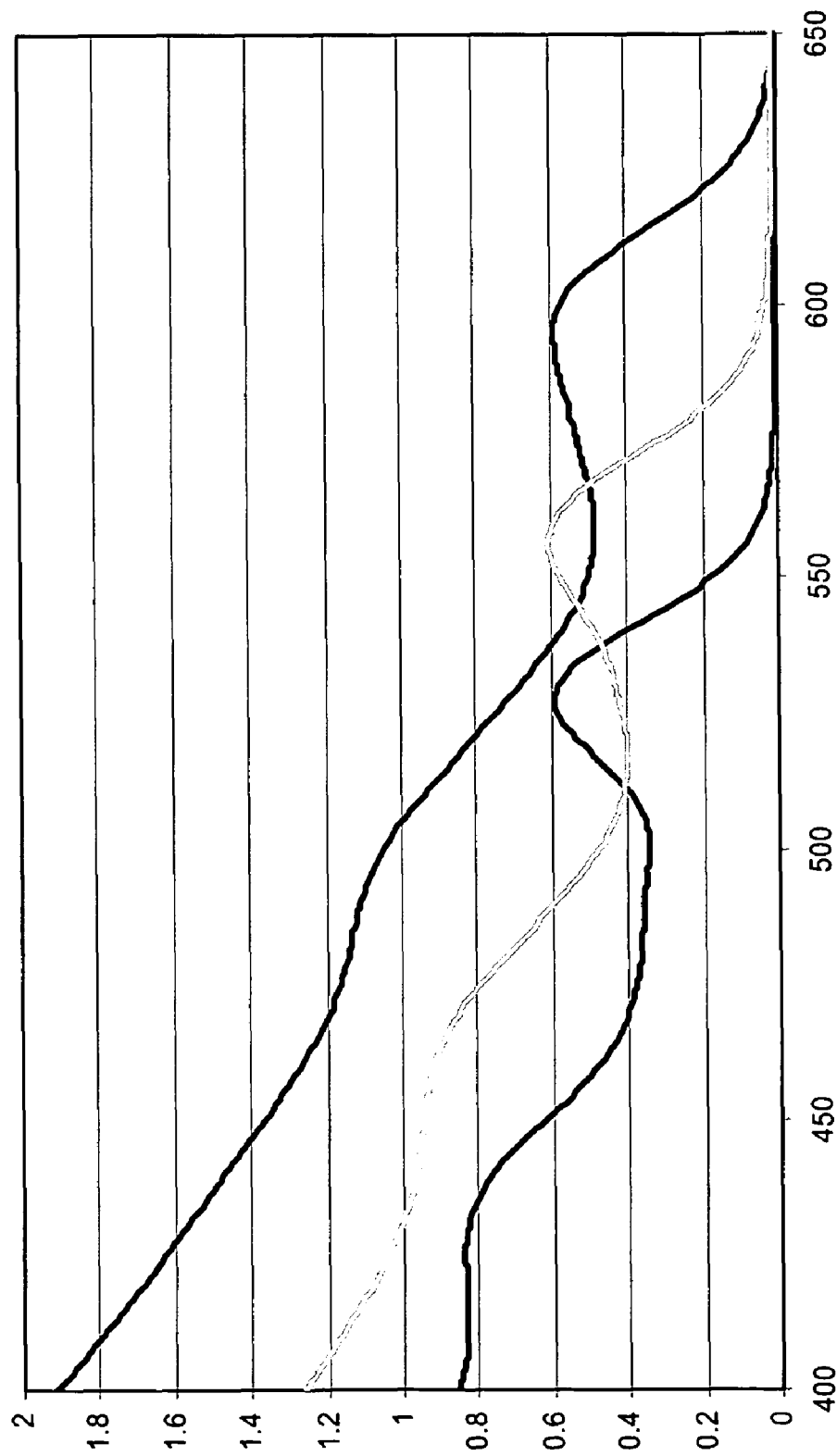
FIG. 5 is a plot of absorption spectra of CdSe nanorods of varying diameters.

In addition to the physical positioning and orientation of the nanostructure (e.g., nanocrystal) component of the active layer, one can adjust or tune the absorption spectrum of the active layer or layers by adjusting the composition of the nanostructure (e.g., nanocrystal) component or components to fit the needs of the particular application. In particular, as noted previously, the absorption spectrum of semiconductor nanocrystals can be adjusted depending upon the composition and/or size of the nanocrystals. For example, InAs nanorods have a greater absorption in the near IR range, e.g., the absorption is red shifted as compared to other nanorods, InP nanorods have a greater absorption in the visible range, CdSe rods have greater absorption in the visible to blue range, while CdS nanorods have an absorption spectrum that is further blue shifted than CdSe nanorods. A chart of absorption spectra of CdSe nanorod compositions having three different size distributions, e.g., diameters, is shown in FIG. 5. In particular, absorption spectra for the CdSe nanorods become more red-shifted as they increase in diameter. As can be seen from the figure and as described herein, by selecting nanorod composition and size, one can select the absorption spectrum of the active layer. Further, by combining nanorods of different size and/or composition, one can tailor a more broad absorption spectrum for the active layer, in order to optimize the functioning of the device over a wider range of conditions.

By way of example, where one wishes to produce a device useful in absorbing solar energy, one can select nanocrystals or combinations of nanocrystals for the active layer(s) whose absorption spectra overlap to more directly match that of the sun in order to more efficiently convert more of the solar (or other light source) spectrum. Such heterogeneous selections of nanocrystals may be combined as a mixture in a single active layer, or they may be provided in multiple discrete layers in a multi-layered device. In some preferred aspects, such different collections of nanocrystal sizes and compositions are provided in discrete layers, so as to maximize the energy conversion from a portion of the relevant spectrum, e.g., each layer includes sufficient concentrations of nanocrystals of a given absorption wavelength range to yield optimal conversion of light in that range.

II. Electrodes

As described previously, the active layer is sandwiched between two conductive layers that operate as electrodes for the photovoltaic device. In its simplest form, e.g., as shown in FIG. 1, the electrode simply comprises a first conductive layer upon which is coated or otherwise deposited the active layer, so that the first conductive layer is electrically connected to the active layer. A second conductive layer is then placed on top and in electrical communication with the active layer. In operation however, a number of considerations must be taken in selecting the appropriate material from which to produce the various conductive layers. As noted elsewhere herein, the coupling of the active layer to the electrodes will typically be such that either electrons or holes are passed from the active layer to the particular electrode, e.g., as a result of selection of electrode materials having higher or lower work functions than the active layer, through the incorporation of blocking layers, etc. As used herein, the phrase "in electrical contact," "in electrical communication," "electrically coupled to," "electrically connected to," etc., encompasses such connection whether it be bidirectional electrical current flow or unidirectional electrical current flow, or any hybrid, e.g., uneven bidirectional current flow.

In the photovoltaic devices described herein, the electrodes that bound the active layer are typically provided to further enhance unidirectional current flow through the overall device. In particular, opposing electrodes are typically provided to have different work functions, so as to permit the flow of electrons from the active layer into one electrode, while permitting the flow of holes from the active layer to the other electrode (or electrons from the other electrode into the active layer). Typically, this is carried out by providing each of the electrodes being fabricated from different materials.

For example, by providing one ITO electrode and one aluminum electrode, one can provide for flow of holes into the ITO electrode and the flow of electrons into the aluminum electrode. A variety of different materials may be employed for the electrodes, provided they generally meet these criteria. Further, electrode material selection will depend, in part, upon the architecture of the device, e.g., as described herein. For example, in some cases, transparent conductive materials, e.g., ITO layered on a transparent substrate, will be desired for at least one electrode, to provide light access to the active layer. In other embodiments, opaque electrode materials are easily employed.

In a number of applications, at least one electrode covers the exposed surface of the device, e.g., the portion of the device exposed to solar or other light energy. In such cases, it is necessary that the electrode at this surface be provided as a transparent or translucent layer. Conventional photovoltaic devices typically employ a glass based electrode upon which is provided a conductive coating, such as an Indium-Tin oxide (ITO) layer. The glass and ITO layer are transparent, allowing light to pass through the electrode and impinge on the active layer. Such electrode configurations are readily employed in the nanocomposite and other photovoltaic and layered devices described herein.

However, for a number of applications, the ultimate device is desired to be flexible or otherwise conformable in a way that use of glass layers may not be practical or even possible. In such cases, it will generally be desired that the electrodes used be flexible as well. Where typical sandwich style device architecture is employed, a transparent polymeric material that employs a metallic or other conductive coating may be used as the electrode layer. Examples of such polymeric materials include, e.g., polyester films or sheeting, e.g., Mylar films available from, e.g., DuPont, polycarbonate films, polyacetate films, polystyrene films or the like. Polymer materials are generally widely commercially available from a variety of sources. In certain preferred aspects, a thin glass layer is used in place of or in addition to a polymer layer to prevent oxygen permeability of many polymer films. Such thin glass sheeting, e.g., on the order of 50 μm thickness or less, can retain the flexibility of most polymer sheets. In such cases, an additional polymer coating may be desirable to prevent scratching of the glass sheet which can lead to breakage. Such polymer layers may be made conductive, as noted previously, by providing a conductive coating, i.e., ITO, aluminization, gold, PEDOT, or other thin, e.g., evaporated, conductive metal films.

In some cases, it will be desirable to protect the active layer from excessive or any exposure to oxygen. In particular, a number of conductive polymers described above are relatively unstable to oxygen, and lose their conductivity upon exposure. As such, it will often be desirable to appropriately seal the device to prevent such exposure. In some cases, the sealing operation may be accomplished through the appropriate selection of electrode layer material. For example, by providing an oxygen impermeable electrode layer on both sides of the active layer, one can protect that layer from oxygen exposure. A number of different polymeric films may be used to provide the oxygen barrier, and yet still provide for flexibility and transparency. Similarly, such films may be readily coated or otherwise treated to render the film conductive, so that it may function as one of the electrodes of the device. In at least one preferred example, an aluminized polymer film is provided as the electrode layer. By employing an oxygen getter, e.g., aluminum, magnesium, etc., as the conductive coating on a flexible transparent layer, one can further reduce the potential for oxygen exposure.

Figure 6:
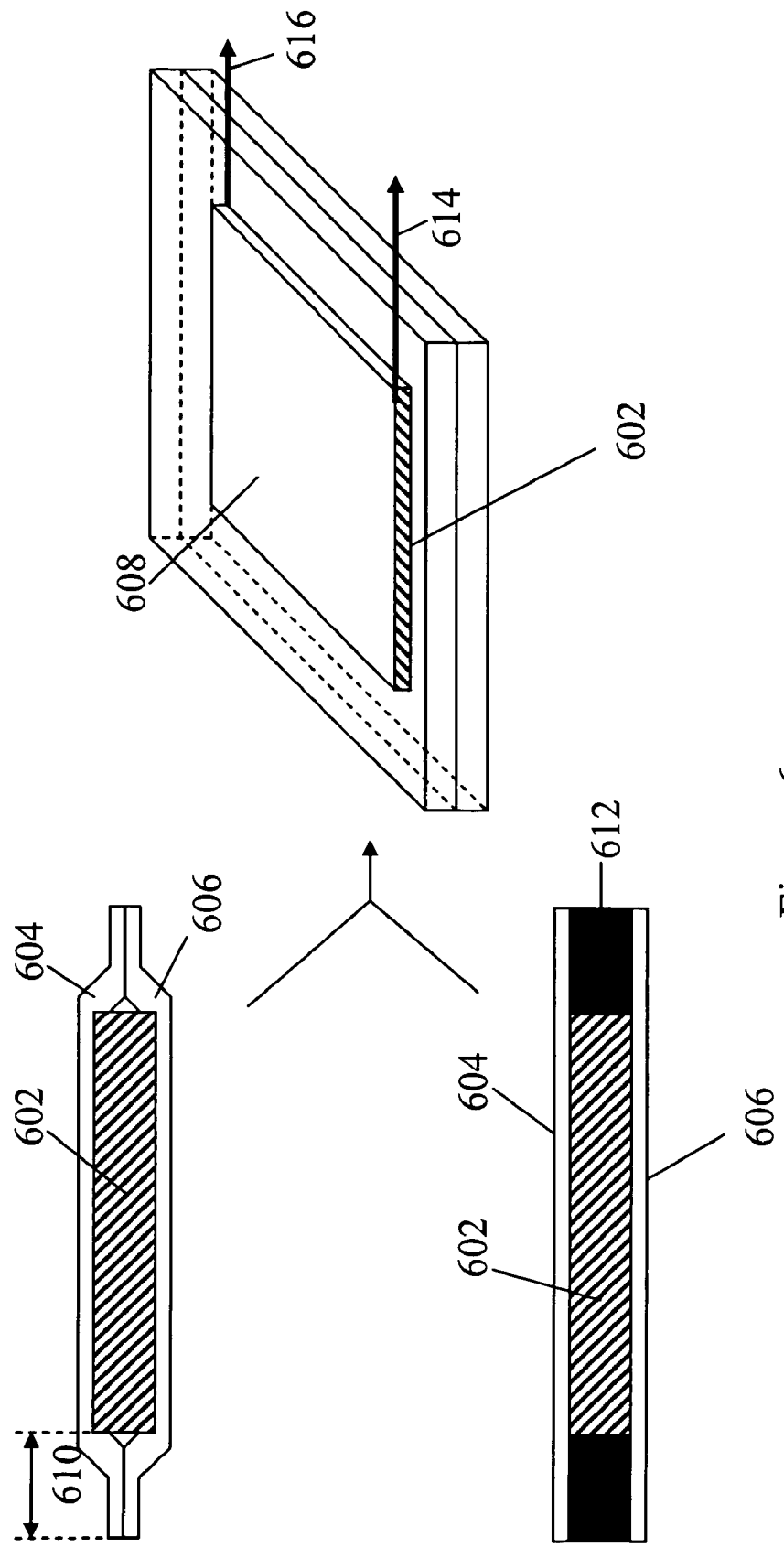
FIG. 6 schematically illustrates a sealed photovoltaic device.

Alternatively, the sealing function may be provided by an additional layer that is added separate from the electrode layer. This may be the case for a traditional planar architectures, e.g., non-flexible, or alternatively, for one of the alternate architectures which are discussed in greater detail below. Regardless of the nature of the sealing layer as a portion of the electrode or as a separate layer, it will be appreciated that the sealing function must encompass the entire active layer. As such, the electrode layer may include nonconductive portions that extend beyond the edge of the conductive portion and the active layer, and which provide the region that seals against a corresponding region of the opposing electrode layer, e.g., using a heat-melt or adhesive-based sealing process. An example of this type of assembly is shown in FIG. 6. As shown, the device includes an active layer 602 sandwiched between two sealing sheets, e.g., film 604 and 606. As noted above, these sheets may be integrated with the electrodes, or they may be separate layers from one or both of the electrodes. Where these sheets are integrated with the electrode components, e.g., sheet electrodes, it will be appreciated that the conductive portion, e.g., 608, of the electrodes or sealing sheets does not extend to overlapping regions 610, where the sealing sheets are bonded together to encase and seal the device and thus protect the active layer. The sealing function is illustrated using alternate means in FIG. 6. As shown in the upper left panel, overlapping sealing sheets are sealed together directly, e.g., thermally bonded at the overlapping regions. Alternatively, as shown in the lower panel, an intermediate layer 612, e.g., an adhesive, or other bonded layer is provided between the sealing sheets, but which does not detract from the sealing function. A finished device 600 is also shown that schematically illustrates the architecture of an overall device, including electrical connections 614 and 616.

For other architectures, described in greater detail below, it is not necessary to provide the electrodes as transparent layers, e.g., where light need not pass through such electrodes. In such cases, any of the aforementioned flexible or other electrode configurations can be used. Alternatively, thin, flexible, metal foil electrode layers may be used. Further, in such cases, any sealing layer may not be layered onto the electrode layer, but may exist in a completely separate plane.

Further, in the case of alternative architectures, the function of protecting the polymer matrix from oxygen, where necessary, may be provided by the packaging of the device itself. For example, a flexible, transparent envelope may be provided to seal the device and prevent oxygen exposure of the active layer. Alternatively, where flexibility of the packaged device is not critical, these alternate architecture devices could be housed in more conventional packages, e.g., hermetically sealed behind a glass or other oxygen impermeable barrier. By way of example, and as discussed in greater detail below, side exposed photovoltaic devices may be encased in a transparent or partially transparent package, where one of the sealing layers is disposed over a side edge of the electrode/active layer/electrode portion of the device.

Although described as planar or sheet type electrodes, it will be appreciated that wire electrodes may also be employed in the devices described herein. Such wire electrodes may be an adjunct to one or more sheet or planar electrodes, or they may be in place of such planar electrodes, e.g., integrated into the active layer. By way of example, wire electrodes may be provided within or on one and/or the other surface of the active layer. The wires may be coated with blocking layers depending upon the function they are to serve, e.g., they may be coated with an electron blocking layer or a hole blocking layer. In certain cases, the wires may be integrated into the active layer, e.g., disposed within the interior of the active layer, e.g., as overlapping arrays of wires or interspersed with complementary wires, e.g., of alternate blocking layer coatings. The device may include both electrodes as wires or wire arrays, or may include one wire array electrode and one sheet electrode.

III. Device Architecture

Again, as noted above, the device architecture in its simplest form comprises a basic planar sandwich structure, e.g., as shown in FIG. 1. However, because of the various improvements described herein, a number of other architectures may be employed that provide for advantages in a number of different applications. These various architectures are generally made possible by the flexible or conformable nature of the materials used to fabricate the devices described herein, properties that are lacking in materials used in conventional, rigid photovoltaics.

As noted previously, the basic architecture of a photovoltaic device in accordance with the invention comprises an active layer that is disposed between two electrodes. The active layer, as termed herein, generally refers to that portion or layer of the device in which light induced charge separation occurs. By light induced charge separation, is meant the generation of free electrons or electron/hole pairs, as a result of photons impinging on the active layer. Such light induction may be direct, e.g., light impacting a material results in the liberation of an electron, or it may be indirect, e.g., light impacting the active layer results in a chemical, physical or electrical change that later results in the liberation of an electron, e.g., through a chemical or physical pathway.

Through the use of the nanocomposite active layers or certain of the other nanostructure based active layers and certain of the electrode configurations described herein, one can produce photovoltaic devices that are efficient, flexible and lightweight. With these characteristics, it is possible to provide a wide variety of alternative architectures for photovoltaic devices and systems that can address many of the shortcomings of conventional photovoltaic technology.

In a first and likely preferred aspect, the basic photovoltaic device in accordance with the invention comprises a standard planar sandwich format, e.g., as shown in FIG. 1. In particular, the overall device 100 is configured in a planar format with the active layer 102 sandwiched between first electrode layer 104 and second electrode layer 106. Where the maximal surface area of the active layer is covered by the electrodes. As it is generally desirable to expose a larger area of the active layer to light, e.g., to collect the greatest amount of solar power, it is generally desirable that such planar devices include at least one electrode layer that is transparent to light of the appropriate wavelength or translucent. The surface of the active layer that is exposed to light, whether through an electrode layer or otherwise, is termed the exposed surface. Typically, photovoltaic devices accomplish this through the use of a glass layer that is coated with a transparent conductive layer, e.g., indium tin oxide (ITO) layer, which together function as the electrode. In such cases, a reflective surface is generally provided upon the second electrode to maximize the amount of solar light collected by the active layer. Typically, these reflective electrode layers may comprise any highly conductive metal that is also relatively highly reflective, e.g., platinum chrome, or the like.

Figure 7:
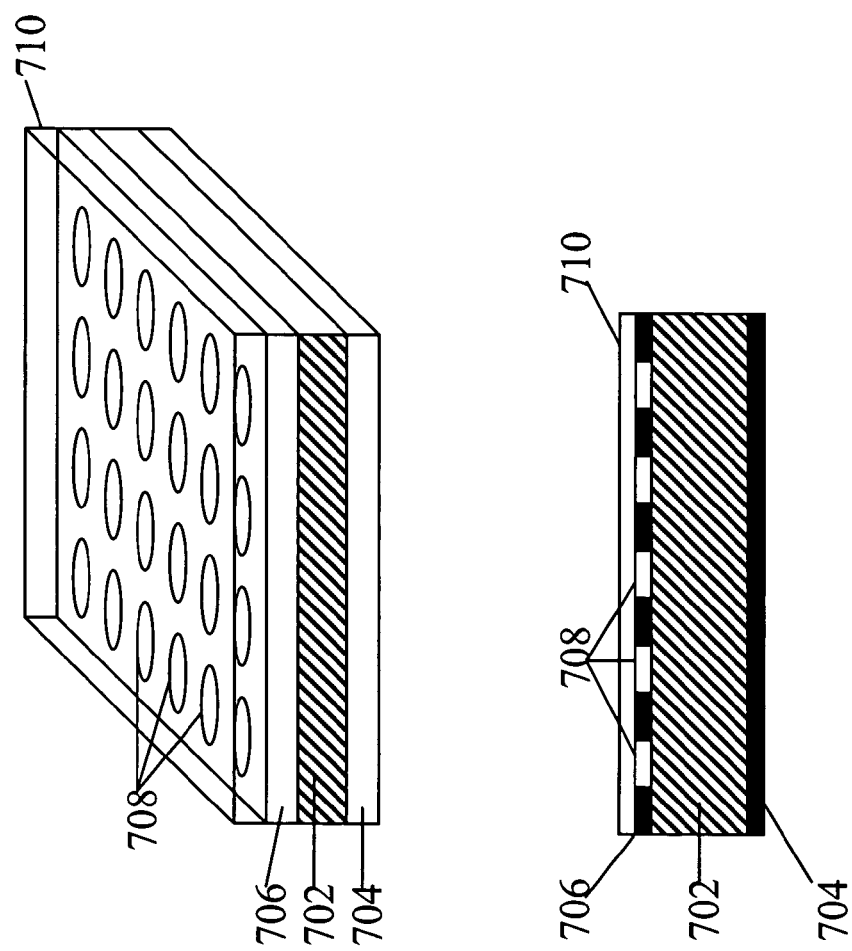
FIG. 7 schematically illustrates an alternate configuration of a photovoltaic device that includes a meshed, perforated, or partially transparent or translucent electrode on its upper surface.

In alternative aspects, it may be less desirable to provide one electrode layer as a transparent layer, e.g., because of inefficiencies in such layers from either a conductivity, flexibility or transmissivity standpoint. In such cases, alternative architectures may be employed that allow one to employ different electrode materials. For example, in a first aspect, one of the electrodes may be provided as a flexible metal layer, e.g., a metallized polymer sheet, e.g., aluminized Mylar, but including an array of transparent zones, e.g., as a screen. In such cases, one would lose some of the exposed surface area of the active layer in exchange for the ability to provide a more efficient first electrode layer. An example of a device employing this architecture is illustrated in FIG. 7. As shown, the active layer 702 is layered onto a lower electrode 704, and an upper electrode 706 is provided over the active layer to create the same sandwich architecture described above. Instead of upper electrode 706 being transparent, however, it is provided with openings or transparent regions 708 which allow light to pass through. The use of these transparent regions or openings allows upper electrode 706 to be comprised of any of a variety of conventional conductive materials, e.g., metal layers, etc. Further, by using thin foils of these conductive layers, one can maintain the flexibility of the overall device. Typically, a further sealing layer of transparent material, e.g., layer 710, may be provided over the top of the upper electrode, and optionally, although not shown, on the outer surface of lower electrode 704. The openings 708, although shown as circular openings, may comprise perforations in a metal layer or the space between gridded arrays of wires, e.g., screen mesh.

In a further alternative architecture, the active layer is disposed between two electrode layers, but the exposed surface is a side surface, rather than a surface that is covered by an electrode. A simplified example of this is shown in FIG. 8A. As shown, active layer 802 is again disposed between two electrode layers 804 and 806. The side or edge surface 808 of the active layer 802 operates as the exposed surface, e.g., the surface through which light is collected. Typically, a transparent or translucent protective layer (e.g., layer 812 in FIG. 8B) is disposed over this side surface 808, in order to prevent degradation or other damage to the active layer 802. In order to optimize the exposed surface 808 for active layer 802, which in turn, maximizes the amount of light that impinges on the active layer, one can configure the side exposed device in a number of different ways. For example, the overall device may be fabricated as an elongated laminate film or tape, e.g., as substantially shown in FIG. 8A. Once produced as a flexible film or tape, the overall device 800 may then be coiled or spooled (as shown), in order to provide an array of exposed surfaces. Alternatively, the overall device may be folded, or stacked in a reciprocating or serpentine architecture, e.g., successively folded back and forth upon itself, to provide greater exposed surface area 808, as shown in FIG. 8B, or to provide a selected footprint for a particular application.

The use of flexible active layer components, or overall devices allows for other useful adjustments in device architecture. By way of example, one of the limits on the output of a photovoltaic device is the amount of surface area that is may be impacted by photons from the relevant light source, e.g., the sun. In conventional, planar photovoltaics, the number of photons that impinges upon the active layer is directly related to the surface area of the device that is exposed to the light source. In many applications, the allowable surface area of a device is dictated by the space in which the device must fit, e.g., a roof top, airplane wing, extraterrestrial platform, i.e., satellite, space station, etc. By providing a device architecture that includes a convex exposed surface and active layer, e.g., as enabled by the flexible devices described herein, one can effectively increase the effective surface area of the device without increasing its footprint. This is particularly true where the relevant light source is oriented at a sub-normal angle to the device.

Figure 8C:
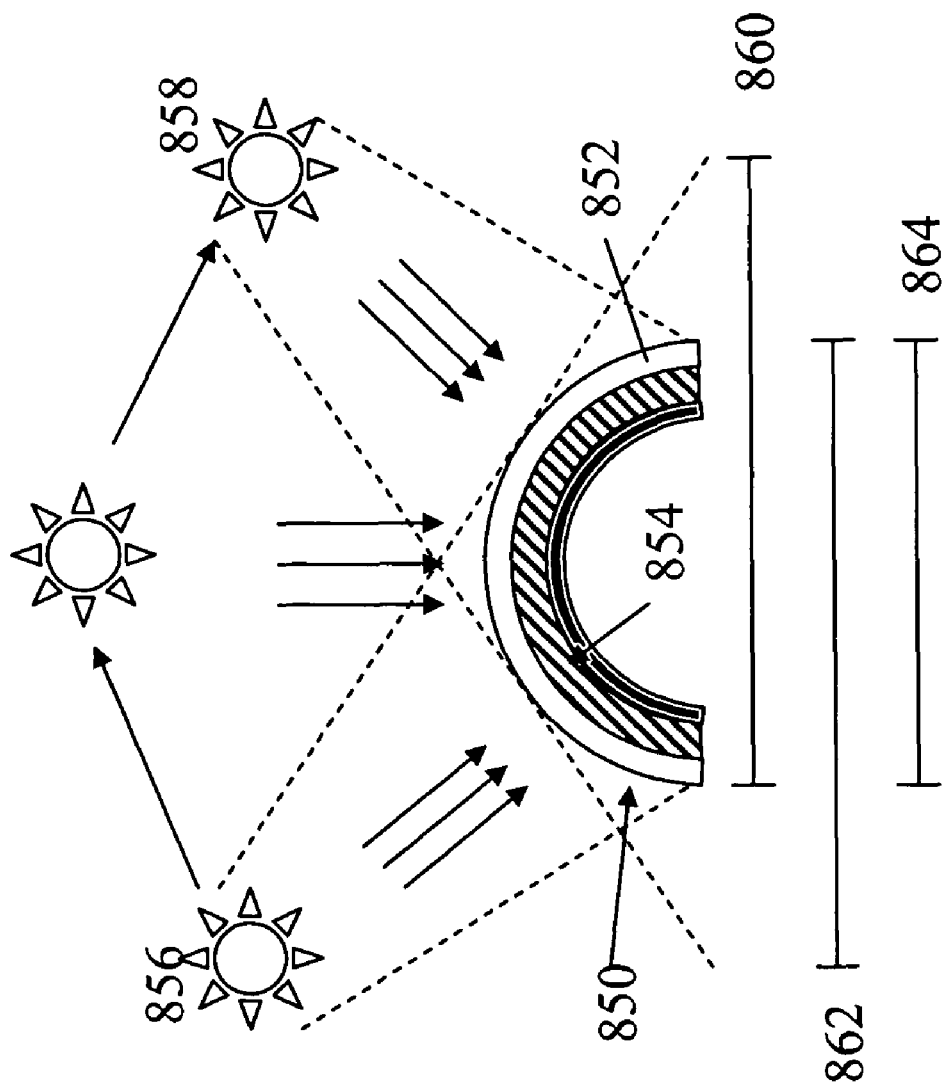

FIG. 8C illustrates the benefits of a convex architecture that achieves this goal. As shown, the device 850 has a convex shape to the exposed surface 852 and active layer 854. When the light source is directed at the device from a non-normal angle, e.g., as illustrated with light source 856 or 858, the number of photons that impact the exposed surface 852 of the device is equivalent to a planar device that has a much larger footprint, e.g., footprint 860 or 862, as indicated by the dashed lines. However, because of its convex architecture, the device 850 has a much smaller footprint, e.g., footprint 864. As noted, where useful space is limited, such devices can meaningfully enhance the ability to harness light energy.

In addition to issues of increasing output without increasing footprint, one of the efficiency issues associated with conventional, planar photovoltaics is that they must be continually rotated, or repositioned in order to provide optimal exposure opportunities, e.g., pointing toward the sun or other light source. For stationary devices, the result is that for a substantial period, the exposed surface will be far from optimally positioned or oriented.

Again, this issue is addressed by the flexible active layer materials that permit the use of contoured exposed surfaces. These contoured exposed surfaces will allow for an optimization of exposure for a wider variety of solar source positions. By way of example, a device may be provided with a convex or concave architecture, e.g., as shown in FIG. 8C. Because of the convex/concave architecture of the device, and particularly the active layer and exposed surface, one can increase the number of photons that impinge on the active layer of the device, regardless of the solar position. As shown in FIG. 8C, use of a convex photovoltaic device provides the ability to increase the number of photons striking a device when the light source is directed at the device at an angle, e.g., when the sun is in declination or otherwise at a nonoptimal angle, without increasing its footprint. In particular, as shown, when a light source 856 or 858 shines onto the effective surface 852 of the convex device 850, a certain number of photons impinge on the active layer 854 within the device. Where the sun is directed at the overall device from an angle, e.g., as shown for the light source 856 and 858, the number of photons captured by the convex device is equivalent to that of a conventional planar device having a much larger footprint 860. In particular, as is shown by the dashed lines, the photons blocked and thus captured by the device is equivalent to that which would have been captured by a much larger flat device under the same circumstances. In many cases, the allowable space for a photovoltaic device or system will be limited, and thus, the convex architecture would be highly desirable. As will be appreciated, due to the non-uniform exposure of the overall effective surface of a convex device, preferred such devices will typically segment the overall device into discrete electrical units, or devices, to prevent current generated in high exposure or light regions from shorting through low exposure or dark regions. Such segmenting may take the form of fabricating discrete pouches sealed from one another, where each pouch is a separately functioning photovoltaic device, e.g., as shown in FIG. 6, but where multiple pouches are structurally coupled together, e.g., in a sheet of many pouches (not shown).

While described in terms of solar exposure, it will be appreciated that the devices described herein, and the various architectures are equally useful in other applications where one may wish to alter the angle at which light impinges on the device, e.g., when using alternate light sources to generate power, e.g., lasers, or for use as optical sensors, etc.

IV. Nanostructure Based Compositions

Another aspect of the present invention provides nanostructure based compositions, e.g., compositions such as those used in the active layers described above. Thus, one general class of embodiments provides a composition comprising a first population of nanostructures and a second population of nanostructures, which first population comprises nanostructures comprising a first material, and which second population comprises nanostructures comprising a second material different from the first material. Adjacent nanostructures are optionally in at least partial direct electrical contact with each other.

The nanostructures can be any of a variety of nanostructures. For example, the nanostructures can comprise a single-crystal nanostructure, a double-crystal nanostructure, a polycrystalline nanostructure, or an amorphous nanostructure. The nanostructures can comprise, e.g., nanocrystals, nanorods, nanowires, nanotubes, branched nanocrystals, nanotetrapods, tripods, bipods, nanodots, quantum dots, nanoparticles, branched tetrapods, or the like, or a combination thereof (e.g., nanorods and nanotetrapods, or nanorods and spherical or nonelongated nanocrystals, among many other possible combinations).

In a preferred class of embodiments, the first material is a first inorganic material and the second material is a second inorganic material. In one class of embodiments, the first material comprises a first semiconductor and the second material comprises a second semiconductor. For example, the first material can comprise an n-type semiconductor and the second material can comprise a p-type semiconductor.

In one class of embodiments, the first and second materials exhibit a type II band offset energy profile. Such compositions can, for example, be used as active layers in photovoltaic devices, or in other electronic and optoelectronic devices. In another class of embodiments, the first and second materials exhibit a type I band offset energy profile. Such compositions can, for example, be used in LEDs, or in other electronic and optoelectronic devices (e.g., where charge recombination and photon emission rather than charge separation is desired; as is known in the art, nanostructure emission spectra can be adjusted by controlling the composition and/or size of the nanostructures).

Essentially any pair of semiconductor materials with an appropriate band offset (i.e., type I or type II) can be used. For example, the first material can comprise a first semiconductor selected from the group consisting of: a Group II-VI semiconductor, a Group III-V semiconductor, a Group IV semiconductor, and an alloy thereof. Similarly, the second material can comprise a second semiconductor, different from the first semiconductor, selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe.

In one class of embodiments, the nanostructures of the first population and the nanostructures of the second population are intermixed in the composition. The nanostructures of the two populations can be uniformly mixed, or they can be partially or completely segregated, e.g., into two or more distinct regions, zones, layers, or the like.

The composition can, if desired, be formed into a film, which is optionally disposed between two electrode layers, e.g., for used in a photovoltaic device, LED, or other device. In some embodiments, the nanostructures of the two populations are intermixed in the film. In other embodiments, however, the film comprises at least a first sublayer and a second sublayer; the first sublayer comprises the first population of nanostructures and the second sublayer comprises the second population of nanostructures. For example, the first sublayer can comprise p-type semiconductor nanostructures and the second sublayer n-type semiconductor nanostructures, optionally with a p-n junction between the sublayers.

As in the preceding aspects, the nanostructures of the first and/or second populations can, but need not be, fused, partially fused, and/or sintered.

In some embodiments, the composition also includes a conductive polymer (e.g., a conductive polymer matrix in which the nanostructures are disposed. In alternative embodiments (e.g., where the first and second population of nanostructures collectively comprise both hole and electron conducting materials), the composition is substantially free of conductive polymer. In certain embodiments, the composition also includes a nonconductive polymer or other binder (e.g., a nonconductive polymer matrix in which the nanostructures are disposed, uniformly or nonuniformly). The composition optionally includes components included to modify the properties of the nanostructures, e.g., surface chemistries and ligands such as those described above.

The nanostructures of the first and/or second populations can be randomly or nonrandomly oriented. For example, each nanostructure of the first and/or second populations can have at least one elongated section oriented predominantly normal to a first plane (e.g., a surface of a film comprising the composition, or a surface of an electrode); as another example, each nanostructure of the first and/or second populations can have at least one elongated section oriented predominantly parallel to the first plane.

V. Device Manufacturing

The devices and compositions of the present invention also provide significant advantages in terms of manufacturability. In particular, current photovoltaic devices rely upon relatively low volume, high cost manufacturing processes in converting wafer scale semiconductor materials to operable photovoltaic devices. Conventional semiconductor based photovoltaics are typically manufactured in a batch mode with the number of devices being determined by the number of wafers used. Such manufacturing processes, because of the starting materials and processes, can be very expensive, and are also not easily scaled up to large scale manufacturing.

The devices of the present invention, on the other hand, are comprised of materials that are readily and cheaply available, or can be produced in substantial quantities at relatively low costs. Further, because of the nature of the various components of the devices, e.g., the active layer components and sealing and/or electrode layers, the processes for making these devices readily lends itself to ultra-high throughput manufacturing. By way of example, because the devices of the invention are typically in the form of flexible laminate structures, e.g., flexible electrodes laminated together with an active layer in between them, they may be produced using high volume film processing techniques, e.g., roll to roll processes, that are conventionally used in the film manufacturing and industrial laminate industries, e.g., in making reflective films, photographic films, etc.

Figure 9:
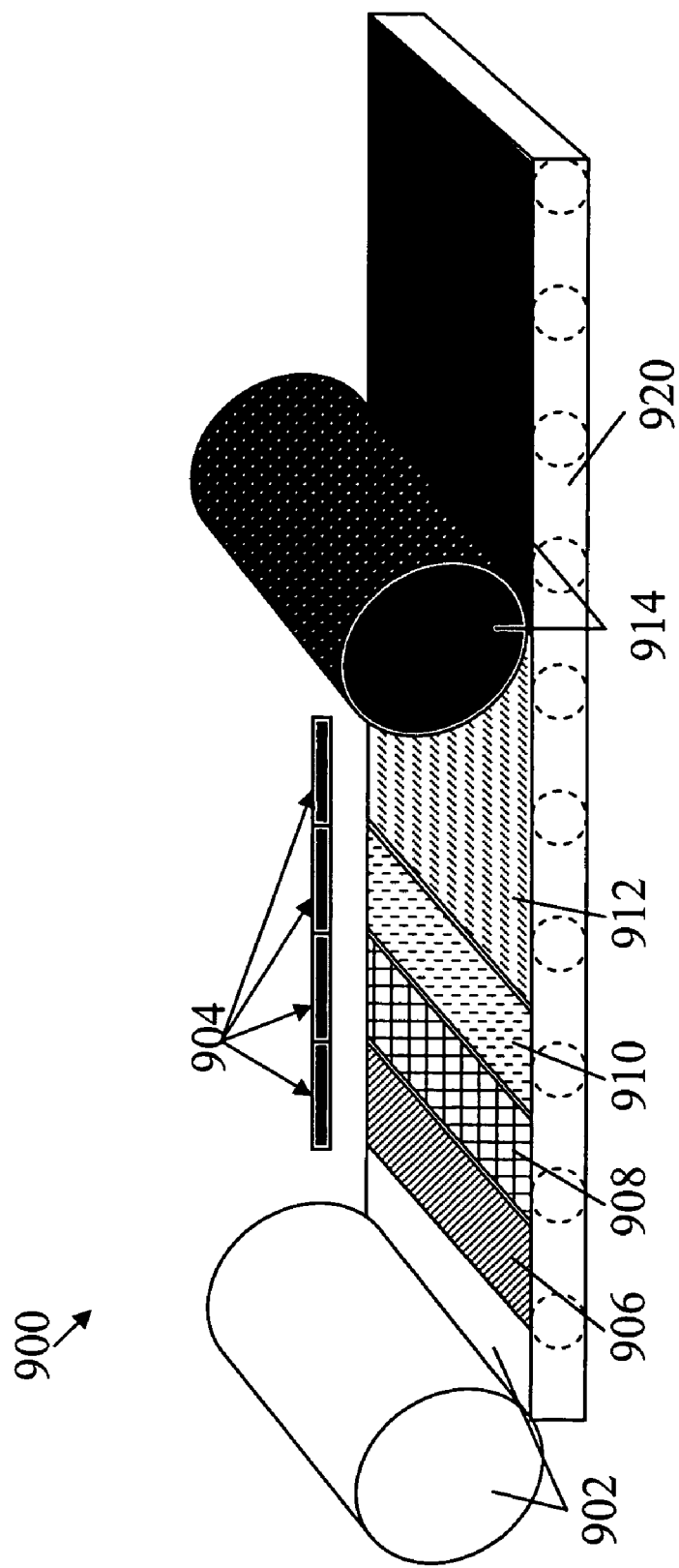
FIG. 9 schematically illustrates a system and process for high throughput fabrication of photovoltaic devices according to the invention.

An example of a roll-to-roll process and system 900 for fabricating devices in accordance with the invention is shown in FIG. 9. As shown, a source of first substrate material, e.g., a roll of substrate material 902, e.g., an aluminized polymer sheet or ITO coated polymer sheet, is rolled out and subjected to a number of deposition steps for the various layers of the device. Other methods of providing the substrate sheet, e.g., as an accordion folded sheet, etc. could be used. Typically, the substrate layer is passed along a conveyor system, e.g., conveyor belt 920. Although described as a conveyor belt, any conveyor system that is capable of moving sheets of substrates, or continuous sheets could be used, e.g., robot arms, moving platforms, etc. Spin coating systems also could be used for smaller sized substrates, and such systems would be encompassed by a conveyor system, as that phrase is used herein. The various layers of material are deposited on the substrate in order to provide the multilayered devices described herein. For example, a source of the nanocomposite photoactive matrix might be provided as a hopper or liquid tank that is fluidly coupled to a deposition system for providing the layer. Such deposition systems might include spraying nozzles, printing heads, screen printing apparatuses, spreading blades, i.e., doctor blades, sheer coating systems, or other useful systems for depositing even, thin films of material, including, e.g., dispensing systems over spin coaters, tape casting systems, film casting systems, and dip coating systems.

In a particular preferred example, using conventional inkjet or screen printing technologies, e.g., as indicated by screen printer(s) 904, one can begin successively laying down multiple layers of material that form the photovoltaic device, e.g., layers 906, 908, 910, 912 and 914. For example, and as shown, in a first printing step, a first layer of blocking material 906 is printed onto moving substrate 902. Such blocking material may be a hole blocking layer or an electron blocking layer depending upon the resulting orientation of the device. Next, a layer of the photoactive material or composite 908, e.g., the nanocrystal/polymer matrix (or the core shell nanocrystal material) is deposited onto the blocking layer. In the case where a mechanical or electrical orientation step is desired for the nanocrystals (or other nanostructures), that would generally be carried out following deposition of this layer, but prior to the application of the next layer. Heating, drying and/or curing steps may be interjected between the various layering steps, to ensure clean interfaces between the layers, e.g., minimal mixing, among layers. Next, a second blocking layer 910 is applied to the upper surface of the active layer. This blocking layer will be the complement of the first blocking layer 906, e.g., if the first layer 906 was a hole blocking layer, this layer would be an electron blocking layer. A second sheet of substrate material 914, e.g., a transparent conductive electrode sheet, e.g., ITO coated polymer sheet as discussed above, is laminated to the top of second blocking layer. Alternatively, and as shown, an ITO or other conductive layer may be applied as a coating layer 912 over the second blocking layer 910, followed by application of the substrate layer 914 which may form the sealing layer. Further, additional layers, e.g., sealing layers or other electrode, blocking and active layers may be applied in additional steps, e.g., in the case of tandem or multiple active layer devices.

Subsequent process steps then attach electrical connections for the sheets of desired size dimensions.

Thus, one class of embodiments provides methods of producing a photovoltaic device. In the methods, a first planar substrate having a first conductive layer disposed thereon is provided. The first substrate is coated with a photoactive matrix that exhibits a type II band offset energy profile and that comprises at least a first population of elongated semiconductor nanostructures, the nanostructures comprising a longitudinal axis, to provide a photoactive layer. The semiconductor nanostructures are oriented such that their longitudinal axes are predominantly oriented normal to the first planar substrate. A second conductive layer is laminated onto the photoactive layer.

The methods can also include providing a blocking layer on the first substrate prior to coating the first substrate with a photoactive matrix and/or providing a blocking layer on the photoactive layer prior to laminating the second conductive layer onto the photoactive layer. The methods optionally include providing one or more sealing layers over opposing surfaces of the photovoltaic device in addition to the first substrate and second conductive layer, whereby the one or more sealing layers hermetically seal the photovoltaic device. As noted above, heating, drying, and/or curing steps may be inserted between the various layering steps, if desired. In addition, the various composition and device components noted above can be adapted for used in these methods, as appropriate. For example, the nanostructures can comprise a nanocrystal, a nanowire, a single-crystal nanostructure, a double-crystal nanostructure, a polycrystalline nanostructure, and/or an amorphous nanostructure.

A related class of embodiments provides a system for fabricating a photovoltaic device. The system comprises a source of a first substrate layer having a first conductive surface, a conveyor system for conveying the first substrate layer, and a source of a photoactive matrix fluidly coupled to a layer deposition system. The layer deposition system is at least partially disposed over the substrate conveyor system, to provide a layer of photoactive matrix on the first substrate layer. The system also includes a source of a second conductive material coupled to the layer deposition system positioned over the substrate conveyor system for depositing a layer of the second conductive material onto a layer of photoactive matrix deposited on the first substrate layer.

In one class of embodiments, the source of first substrate material comprises a rolled sheet of first substrate material. The source of first substrate material optionally also includes a source of first conductive material and a deposition system for depositing the first conductive material onto the first substrate material to provide the first conductive surface. Examples of suitable layer deposition systems include, but are not limited to, a doctor-blade, a screen printing system, an ink-jet printing system, a dip coating system, a sheer coating system, a tape casting system, and a film casting system. Any of the above embodiments can be applied to this embodiment as well, to the extent they are relevant.

Another general class of embodiments provides methods of producing a photovoltaic device. In these methods, a first planar substrate having a first conductive layer disposed thereon is provided. To provide a photoactive layer, the first substrate is coated with a composition that comprises a population of nanostructures. The nanostructures comprise a core of a first material and a shell of a second material different from the first material. The nanostructures are fused, partially fused, and/or sintered, and a second conductive layer is layered onto the photoactive layer.

All of the various optional configurations and features noted in the embodiments above apply here as well, to the extent they are relevant; e.g., for types of nanostructures, types of materials, provision of blocking and/or sealing layers, and the like.

Yet another class of embodiments provides methods of producing a layered device comprising two (or more) populations of nanostructures (e.g., a photovoltaic device, an LED, or the like). The layered device comprises a first population of nanostructures comprising a first material and a second population of nanostructures comprising a second material different from the first material. In the methods, a first substrate is provided and coated with a composition comprising the first population of nanostructures to provide a first layer.

In one class of embodiments, the nanostructures of the first and second populations are intermixed in the first layer. In this class of embodiments, the first substrate is coated with a composition comprising a mixture of the first and second populations of nanostructures to provide the first layer.

In another class of embodiments, the layered device comprises at least a first layer comprising the first population of nanostructures and a second layer comprising the second population of nanostructures. In this class of embodiments, the methods include coating the first substrate with a composition comprising the second population of nanostructures, to provide the second layer. In a related class of embodiments, the second population of nanostructures is disposed on the first substrate. For example, nanostructures that cannot be solution-processed (e.g., some nanowires) can be grown on the first substrate (e.g., on an electrode); a solvent process can be used to add a layer of solvent dispersible nanostructures, as above, or other layers can be laminated over the first substrate-second nanostructure population layer.

The methods optionally include layering a second conductive layer onto the first layer (or the second layer, depending on the number and orientation of the layers). Similarly, the methods optionally include providing a blocking layer on the first substrate prior to coating the first substrate with the composition comprising the first population of nanostructures and/or providing a blocking layer on the first (or second) layer prior to laminating the second conductive layer onto the first (or second) layer.

All of the various optional configurations and features noted in the embodiments above apply here as well, to the extent they are relevant; e.g., for types of nanostructures, types of materials, fusing, partial fusing, and/or sintering of nanostructures, and the like.

A related class of embodiments provides a system for fabricating a layered device, where the device comprises a layer in which a first and a second population of nanostructures are intermixed. The nanostructures of the first population comprise a first material, and the nanostructures of the second population comprise a second material different from the first material. The system comprises a source of a first substrate layer, a conveyor system for conveying the first substrate layer, and a source of a composition comprising the first and second populations of nanostructures, fluidly coupled to a layer deposition system. The layer deposition system is at least partially disposed over the substrate conveyor system, to provide a layer in which the nanostructures of the first and second populations are intermixed on the first substrate layer.

All of the various optional configurations and features noted in the embodiments above apply here as well, to the extent they are relevant; e.g., for types of nanostructures, types of materials, provision of blocking and/or sealing layers, fusing, partial fusing, and/or sintering of nanostructures, provision of a layer of a second conductive material, types of layer deposition systems, and the like. It is worth noting that the first substrate layer optionally has a first conductive surface (or is otherwise conductive).

Another related class of embodiments provides a system for fabricating a layered device, where the device comprises a first layer comprising a first population of nanostructures and a second layer comprising a second population of nanostructures. The nanostructures of the first population comprise a first material, and the nanostructures of the second population comprise a second material different from the first material. The system comprises a source of a first substrate layer, a conveyor system for conveying the first substrate layer, a source of a first composition comprising the first population of nanostructures fluidly coupled to a layer deposition system (the layer deposition system being at least partially disposed over the substrate conveyor system, to provide a first layer), and a source of a second composition comprising the second population of nanostructures fluidly coupled to the layer deposition system (the layer deposition system being at least partially disposed over the substrate conveyor system, to provide a second layer).

All of the various optional configurations and features noted in the embodiments above apply here as well, to the extent they are relevant; e.g., for types of nanostructures, types of materials, provision of blocking and/or sealing layers, fusing, partial fusing, and/or sintering of nanostructures, provision of a layer of a second conductive material, types of layer deposition systems, and the like.

VI. Synthesis of Nanostructures

Nanostructures can be fabricated and their size can be controlled by any of a number of convenient methods that can be adapted to different materials. For example, synthesis of nanocrystals of various composition is described in, e.g., Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urban et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-,Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "*Epitaxial growth and photochemical annealing of graded CdS/ZnS shells on colloidal CdSe nanorods*" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

In certain embodiments, the collection or population of nanostructures is substantially monodisperse in size and/or shape. See e.g., US patent application 20020071952 by Bawendi et al entitled "Preparation of nanocrystallites."

Kits

The devices and compositions herein can be packaged as kits. For example, any of the devices or compositions of the invention can be packaged in one or more containers. Similarly, kits can include instructional materials that can be used to practice the methods herein, operate the devices herein, use the compositions herein and/or operate the systems herein. Kits can include other convenient features, such as protective packaging materials, instructional materials for assembly of components of the devices or systems, electrical couplings to couple devices or systems to an electrical input or output, or the like.

Although described in some detail for purposes of understanding, the scope of the claimed invention herein is not limited to the disclosure and is only limited by the claims appended hereto or to any related patent or application, including without limitation any continuation, in whole or in part, divisional, reissue, reexamination, etc.

EXAMPLES

The following sets forth a series of experiments that demonstrate construction of nanocomposite and nanostructure based photovoltaic devices. It is understood that the examples and embodiments described herein are for illustrative purposes only and that various modifications or changes in light thereof will be suggested to persons skilled in the art and are to be included within the spirit and purview of this application and scope of the appended claims. Accordingly, the following examples are offered to illustrate, but not to limit, the claimed invention.

Example 1

Nanocomposite Photovoltaic Device

This example describes fabrication of a CdSe nanocrystal-P3HT polymer nanocomposite photovoltaic device. CdSe nanorods have been used; CdSe nanotetrapods can also be used, as can other nanostructure types and/or compositions.

Substrate Cleaning

Substrates (e.g., ITO on glass, from Thin Film Devices, Inc., www.tfdinc.com) are cleaned, e.g., using the following procedure. Substrates are wiped with isopropanol, ultrasonicated in isopropanol, ultrasonicated in 2% Hellmanex™ deionized water, rinsed very thoroughly under flowing deionized water, ultrasonicated in deionized water, ultrasonicated in semiconductor grade acetone, and ultrasonicated in semiconductor grade isopropanol. Each sonication is for 15 minutes. The substrates are then oxygen plasma cleaned, at 200 W (1% reflected power) for 10 minutes with oxygen introduced at a pressure of approximately 400 mTorr into a vacuum of 80 mTorr.

PEDOT Layer Processing

PEDOT/PSS Poly(3,4-ethylenedioxythiophene) poly(styrenesulfonate) (e.g., Baytron® P VP AI 4083 from H. C. Starck) is filtered through a 0.2 μm pore size cellulose acetate filter. PEDOT is spin coated onto the substrates at 3000 rpm for 60 seconds. The PEDOT layer is then cured by baking the spincoated substrate on a hotplate at 120° C. for 60 minutes under atmospheric conditions.

Preparation of P3HT in Chloroform ($CHCl_3$) Solution

The P3HT solution is prepared in a glove-box with an argon atmosphere. Anhydrous chloroform (previously filtered with a 0.2 μm pore size PTFE filter) is added to the P3HT, such that the concentration of P3HT in the resulting solution is 20 mg/ml. The solution is vortexed for 5 minutes, stirred for approximately 1 hour on a stir plate, and heated at 56° C. for 10 minutes while stirring. The P3HT:chloroform solution is filtered with a 0.2 μm pore size PTFE filter, and protected from light and oxygen.

Preparation of Nanocrystal Solution

The nanocrystal solution is prepared in the glove-box. CdSe nanocrystals are dissolved in anhydrous chloroform (previously filtered with a 0.2 μm pore size PTFE filter) at a concentration between 70-80 mg/ml. A small aliquot of known volume of the CdSe nanocrystal solution is removed from the glove box, the nanocrystals are dried under nitrogen flow, and the nanocrystals are weighed to determine the concentration of the nanocrystal solution. (These nanocrystals, which have been exposed to oxygen, are then discarded and are not used to fabricate the photovoltaic device.) If necessary, additional chloroform is added to adjust the concentration of the nanocrystal solution remaining in the glove box to 70-80 mg/ml.

Preparation of Nanocrystal:P3HT Blend Solution

The CdSe nanocrystal:polymer solution is also prepared in the glove box. The $CdSe:CHCl_3$ solution and the $P3HT:CHCl_3$ solution are combined into a micro-centrifuge tube, such that the ratio of CdSe:P3HT is 90:10 by weight, the concentration of P3HT in the final solution is between 5-7 mg/ml, and the concentration of CdSe nanocrystals in the final solution is between 50-70 mg/ml. For example, if the concentration of CdSe in $CHCl_3$ is 75 mg/ml and the P3HT in $CHCl_3$ is 20.0 mg/ml, 300 μl of CdSe nanocrystal solution and 125 μl of P3HT solution are mixed, such that the resulting ratio of CdSe:P3HT is 90:10, the resulting concentration of P3HT is 5.9 mg/ml, and the resulting concentration of CdSe is 52.9 mg/ml. The solution is vortexed for 2 minutes and centrifuged for 2 minutes at 11,000 rpm in a microcentrifuge.

Spincoating of nanocrystal:P3HT blend solution

The CdSe nanocrystal:P3HT blend is spin coated onto the ITO/PEDOT substrates (in the glove box). Typically, 100 μl of solution is used for each substrate, with a spin speed of 1200 rpm for 40 seconds. Any solution on the back side of the substrates is removed by wiping with chloroform.

Evaporation of Aluminum Cathodes

The nanocomposite-PEDOT-coated substrates are transferred without exposure to oxygen into an evaporator. Aluminum (purity 99.999%) is evaporated onto them at a rate of 5 A/s under a vacuum of less than $1 \times 10^{-7}$ torr to a thickness of approximately 200 nm.

Silver Paste

Any nanocomposite and/or PEDOT film on top of the ITO electrode contact pins is removed. Silver paste is applied to establish electrical connection to the ITO pins. The resulting devices are then characterized as desired.

Example 2

CdSe-CdTe Nanocrystal Photovoltaic Device

This example describes fabrication of a photovoltaic device comprising two intermixed populations of nanocrystals, CdSe nanocrystals and CdTe nanocrystals.

Substrate Cleaning

Substrates (e.g., ITO on glass, from Thin Film Devices, Inc., www.tfdinc.com) are cleaned, e.g., using the following procedure. Substrates are wiped with isopropanol, ultrasonicated in isopropanol, ultrasonicated in 2% Hellmanex™ deionized water, rinsed very thoroughly under flowing deionized water, ultrasonicated in deionized water, ultrasonicated in semiconductor grade acetone, and ultrasonicated in semiconductor grade isopropanol. Each sonication is for 15 minutes. The substrates are then oxygen plasma cleaned, at 200 W (1% reflected power) for 10 minutes with oxygen introduced at a pressure of approximately 400 mTorr into a vacuum of 80 mTorr.

PEDOT Layer Processing

PEDOT/PSS Poly(3,4-ethylenedioxythiophene) poly(styrenesulfonate) (e.g., Baytron® P VP AI 4083 from H. C. Starck) is filtered through a 0.2 μm pore size cellulose acetate filter. PEDOT is spin coated onto the substrates at 3000 rpm for 60 seconds. The PEDOT layer is then cured by baking the spincoated substrate on a hotplate at 120° C. for 60 minutes under atmospheric conditions.

Preparation of Cdse:Cdte Bicrystal Blend Solution

The CdSe:CdTe bicrystal blend solution is prepared in a glove-box with an argon atmosphere. CdTe nanocrystals are washed by dissolving them in toluene and precipitating them with isopropanol 3 times; CdSe nanocrystals are washed by dissolving them in toluene and precipitating them with methanol 3 times. For surface treatment, both CdSe and CdTe nanocrystals are stirred in a solution of toluene and phenylphosphonic acid (PPA) at 110° C. for 20 hours. (The surface treatment step may not be necessary and could be omitted, or a different nanocrystal cleaning procedure, e.g., using pyridine, followed by treatment with PPA or another ligand may be substituted for this step.) After precipitation with isopropanol, the nanocrystals are dissolved in toluene, e.g., at a concentration of 95 mg/ml (for CdTe) and 110 mg/ml (for CdSe), respectively. The CdTe:toluene solution and the CdSe:toluene solution are combined into a 1.5 ml glass vial, such that the ratio of CdTe:CdSe is 50:50 by weight, and the concentration of nanocrystals in the final solution is between about 80-100 mg/ml. For example, if the concentration of CdTe in toluene is 95 mg/ml and the CdSe in toluene is 110 mg/ml, 500 ul of CdTe nanocrystal solution and 432 ul CdSe nanocrystal solution are mixed, such that the resulting ratio of CdTe:CdSe is 50:50 and the resulting concentration of nanocrystals is 102 mg/ml. The solution is vortexed for 2 minutes, heated at 56° C. for 10 minutes, and ultrasonicated for 15 minutes. After the solution is transferred to a microcentrifuge vial, it is centrifuged for 2 minutes at 11,000 rpm in a microcentrifuge.

Spincoating of CdSe:CdTe Nanocrystal Blend Solution

The CdTe:CdSe solution is spincoated onto the ITO/PEDOT:PSS substrates (in the glove box). Typically, 120 μl of solution is used for each substrate, with a spin speed of 950 rpm for 40 seconds. Any solution on the back side of the substrates is removed by wiping with chloroform.

Evaporation of Aluminum Cathodes

The nanocrystal-PEDOT-coated substrates are transferred without exposure to oxygen into an evaporator. Aluminum (purity 99.999%) is evaporated onto them at a rate of 5 A/s under a vacuum of less than $1 \times 10^{-7}$ torr to a thickness of approximately 200 nm.

Silver Paste

Any nanocrystal and/or PEDOT film on top of the ITO electrode contact pins is removed. Silver paste is applied to establish electrical connection to the ITO pins. The resulting devices are then characterized as desired.

It will be understood from the foregoing that variations and uses of the present invention are encompassed. For example, any of the compositions of the invention can be used to form devices of the invention. Systems of the invention can be used to make compositions and/or devices of the invention. Methods of the invention can be used to make the compositions, systems or devices herein. Similar variations will be apparent to one of skill.

Furthermore, while the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A photovoltaic device, comprising:
   a first electrode layer;
   a second electrode layer; and
   at least a first photoactive layer comprising a first sublayer and a second sublayer disposed between the first and second electrode layers, wherein the first sublayer comprises an electron-conducting first population of nanostructures which is made from a first material and the second sublayer comprises a hole-conducting second population of nanostructures that is made from a second material which is different from the first material, wherein the first and second populations of nanostructures are disposed in a nonconductive polymer matrix, and wherein the first and second populations of nanostructures are randomly oriented in the photoactive layer, and wherein at least a subset of nanostructures from at least the first population of nanostructures are at least partially fused to each other.

2. The photovoltaic device of claim 1, wherein at least a subset of nanostructures from the second population of nanostructures are at least partially fused to each other.

3. The photovoltaic device of claim 2, wherein the first and second population of nanostructures exhibit a type II band offset energy profile with respect to each other.

4. The photovoltaic device of claim 3, wherein at least the first population of nanostructures is not grown from any layer in the photovoltaic device and includes at least one nanostructure which is not in direct contact with any other layer in the device.

5. The photovoltaic device of claim 1, wherein the first population of nanostructures comprises nanorods.

6. The photovoltaic device of claim 1, wherein the first and second populations of nanostructures comprise nanorods.

7. The photovoltaic device of claim 1, wherein the first population of nanostructures comprises a first inorganic material and the second population of nanostructures comprises a second inorganic material different from the first inorganic material.

8. The photovoltaic device of claim 1, wherein the first and second populations of nanostructures comprise at least a portion that is comprised of a semiconductor selected from Group II-VI, Group III-V or Group IV semiconductors or alloys thereof.

9. The photovoltaic device of claim 1, wherein the first population of nanostructures comprises nanorods that comprise one or more of: CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, or PbTe.

10. The photovoltaic device of claim 1, wherein the photoactive layer is substantially free of conductive polymer.

11. The photovoltaic device of claim 1, further comprising a hole or electron blocking layer disposed between the photoactive layer and the first or second electrode.

12. The photovoltaic device of claim 1, further comprising a hole blocking layer disposed between the photoactive layer and the first electrode and an electron blocking layer disposed between the photoactive layer and the second electrode.

13. The photovoltaic device of claim 1, wherein at least one of the first and second electrodes is flexible.

14. The photovoltaic device of claim 1, wherein at least one of the first and second electrodes comprises a transparent conductive layer.

15. The photovoltaic device of claim 1, wherein the first and second populations of nanostructures comprise nanocrystals having different size distributions.

16. The photovoltaic device of claim 1, wherein at least the first population of nanostructures is oriented in the photoactive layer.

17. The photovoltaic device of claim 1, wherein the first population of nanostructures comprises CdSe and the second population of nanostructures comprises CdTe.

* * * * *